United States Patent
Shaheen et al.

(10) Patent No.: US 7,569,857 B2
(45) Date of Patent: Aug. 4, 2009

(54) DUAL CRYSTAL ORIENTATION CIRCUIT DEVICES ON THE SAME SUBSTRATE

(75) Inventors: Mohamad A. Shaheen, Portland, OR (US); David Simon, legal representative, Portland, OR (US); Peter Tolchinsky, Beaverton, OR (US); Jack T Kavalieros, Portland, OR (US); Brian S Doyle, Portland, OR (US); Suman Datta, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 45 days.

(21) Appl. No.: 11/529,974

(22) Filed: Sep. 29, 2006

(65) Prior Publication Data
US 2008/0079003 A1 Apr. 3, 2008

(51) Int. Cl.
*H01L 29/04* (2006.01)
(52) U.S. Cl. .................. 257/69; 257/627; 257/E29.004
(58) Field of Classification Search .................. 257/64, 257/69, 70, 627, 369, 401, E29.004
See application file for complete search history.

(56) References Cited

U.S. PATENT DOCUMENTS

| 7,291,886 | B2* | 11/2007 | Doris et al. ................. 257/350 |
| 2005/0009305 | A1* | 1/2005 | Anderson et al. ........... 438/479 |
| 2005/0184283 | A1* | 8/2005 | Maeda et al. .................. 257/4 |
| 2007/0108528 | A1* | 5/2007 | Anderson et al. ........... 257/365 |
| 2007/0254412 | A1* | 11/2007 | Dyer et al. ................... 438/142 |

OTHER PUBLICATIONS

Brian S. Doyle et al., U.S. Appl. No. 11/234,014, filed Sep. 22, 2005, entitled "Multiple Crystal Orientations on the Same Substrate", 33 pgs inc. Figures.
Mohamad A. Shaheen et al., U.S. Appl. No. 11/377,475, filed Mar. 15, 2006, entitled "Formation of a Multiple Crystal Orientation Substrate", 44 pgs inc. Figures.
Mohamad A. Shaheen et al., U.S. Appl. No. 11/453,444, filed Jun. 14, 2006, entitled "Ultra-Thin Oxide Bonding for S1 to S1 Dual Orientation Bonding", 19 pgs inc. Figures.

* cited by examiner

*Primary Examiner*—Minh-Loan T Tran
*Assistant Examiner*—W. Wendy Kuo
(74) *Attorney, Agent, or Firm*—Blakely, Sokoloff, Taylor & Zafman LLP

(57) ABSTRACT

Embodiments of the invention provide a substrate with a device layer having different crystal orientations in different portions or areas. One layer of material having one crystal orientation may be bonded to a substrate having another crystal orientation. Then, a portion of the layer may be amorphized and annealed to be re-crystallized to the crystal orientation of the substrate. N- and P-type devices, such as tri-gate devices, may both be formed on the substrate, with each type of device having the proper crystal orientation along the top and side surfaces of the claimed region for optimum performance. For instance, a substrate may have a portion with a <100> crystal orientation along a top and sidewalls of an NMOS tri-gate transistor and another portion having a <110> crystal orientation along parallel top and sidewall surfaces of a PMOS tri-gate transistor.

4 Claims, 11 Drawing Sheets

DUAL CRYSTAL ORIENTATION CIRCUIT DEVICES ON THE SAME SUBSTRATE

FIELD

Circuit devices and the manufacture and structure of circuit devices.

BACKGROUND OF THE INVENTION

Increased performance of circuit devices on a substrate (e.g., integrated circuit (IC) transistors, resistors, capacitors, etc. on a semiconductor (e.g., silicon) substrate) is usually a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to increase performance by increasing movement of electrons (e.g., charge carriers) in N-type MOS device (NMOS) channels and/or by increasing movement of positive charged holes (e.g., charge carriers) in P-type MOS device (PMOS) channels. Increased or higher charge carrier mobility may lead to increased drive current (such as at drive current saturation), which also increases performance.

In some circuit devices, a substrate of varying layers having different crystal orientations is desired for increased performance. "Crystal orientation" refers to the crystal lattice structure of materials, such as semiconductors, used in the fabrication of semiconductor substrates. Crystal orientation planes of silicon are typically represented as <100>, <110> and <111> and are representatively shown in FIG. 1. Monocrystalline silicon is an anisotropic material, meaning that the properties of monocrystalline silicon change depending on the direction from which they are measured within the crystal lattice of silicon. This may be explained by the different atomic densities within each of the <100>, <110>, and <111> crystal planes that are illustrated in FIG. 1. The atomic densities of the <100> crystal plane, the <110> crystal plane, and the <111> crystal plane are illustrated in FIG. 1. Examples of properties that change with the direction in silicon include the Young's Modulus (a measure of the strength of the material), the mobility of electrons (or holes), the etch rate, and the oxidation rate. For example, the Young's modulus of silicon is 1.3 $e^{12}$ dynes/cm$^2$ in the <100> crystal plane, 1.7 $e^{12}$ dynes/cm$^2$ in the <110> crystal plane, and 1.9 $e^{12}$ dynes/cm$^2$ in the <111> crystal plane. As another example, the mobility of electrons in the <100> crystal plane is known to be greater than in the <110> crystal plane of silicon, resulting in a current drivability in the <100> direction that is approximately 15 percent (%) greater than the current drivability in the <110> direction.

Many integrated circuits, such as microproccesors, make use of N- and P-MOS transistors formed on the same substrate. NMOS transistors have increased charge carrier mobility and/or drive current (e.g., have increase performance or function better) on a substrate with a <100> crystal orientation. PMOS transistors, in contrast, have increased charge carrier mobility and/or drive current (e.g., have increase performance or function better) on a substrate with a <110> crystal orientation.

DETAILED DESCRIPTION

In various embodiments, an apparatus and/or method relating to the formation of a substrate are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
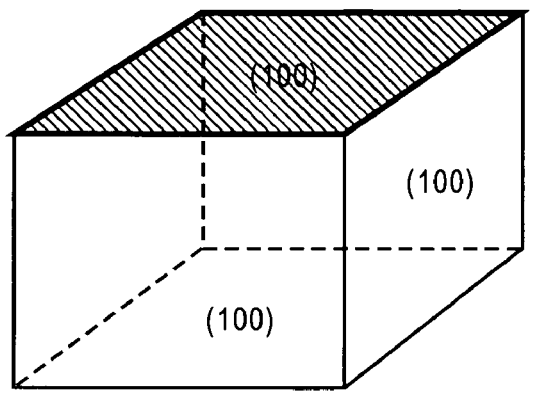
FIG. 1 illustrates crystal orientations.
Figure 1:
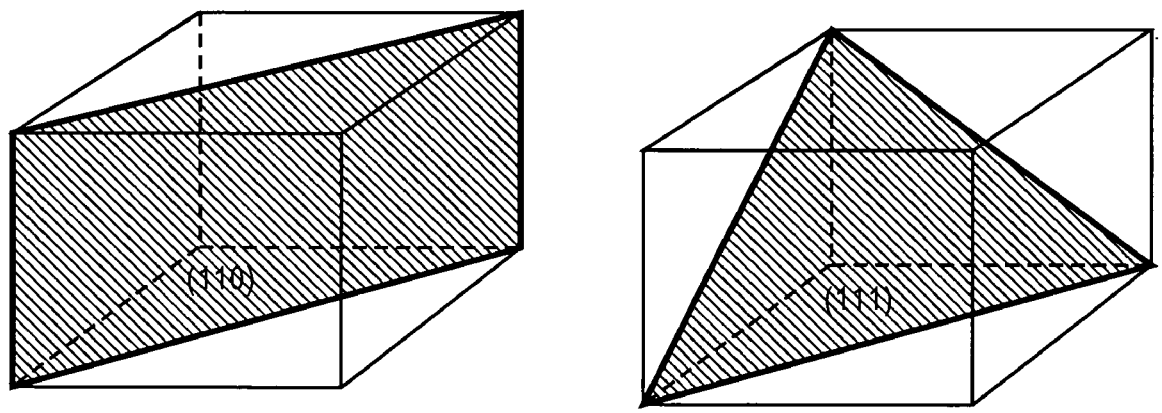
Figure 2A:
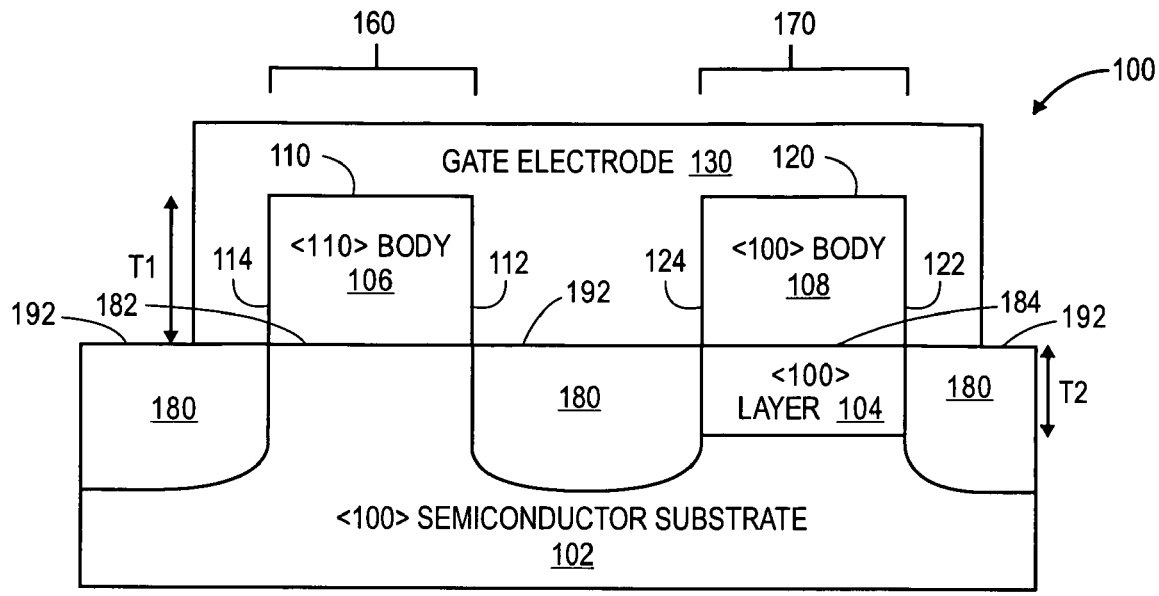
FIG. 2A is a cross sectional side view that illustrates the semiconductor device of one embodiment of the present invention.
Figure 2B:
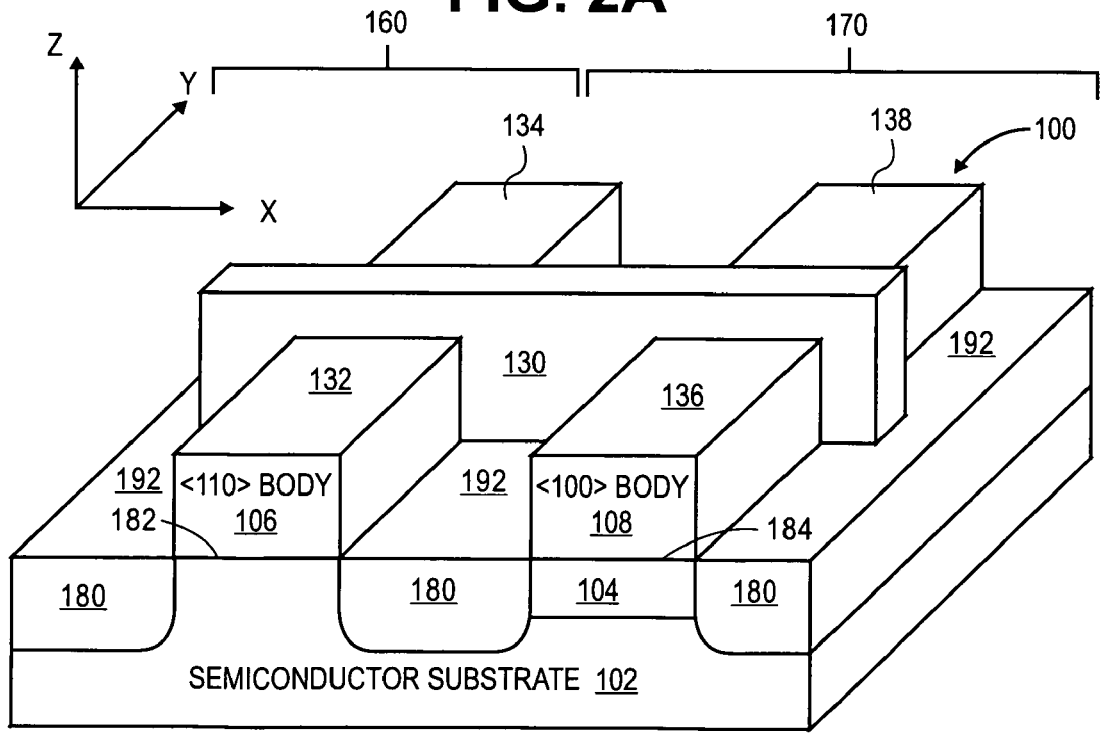
FIG. 2B is a perspective view that illustrates the semiconductor device of one embodiment of the present invention.
Figure 2C:
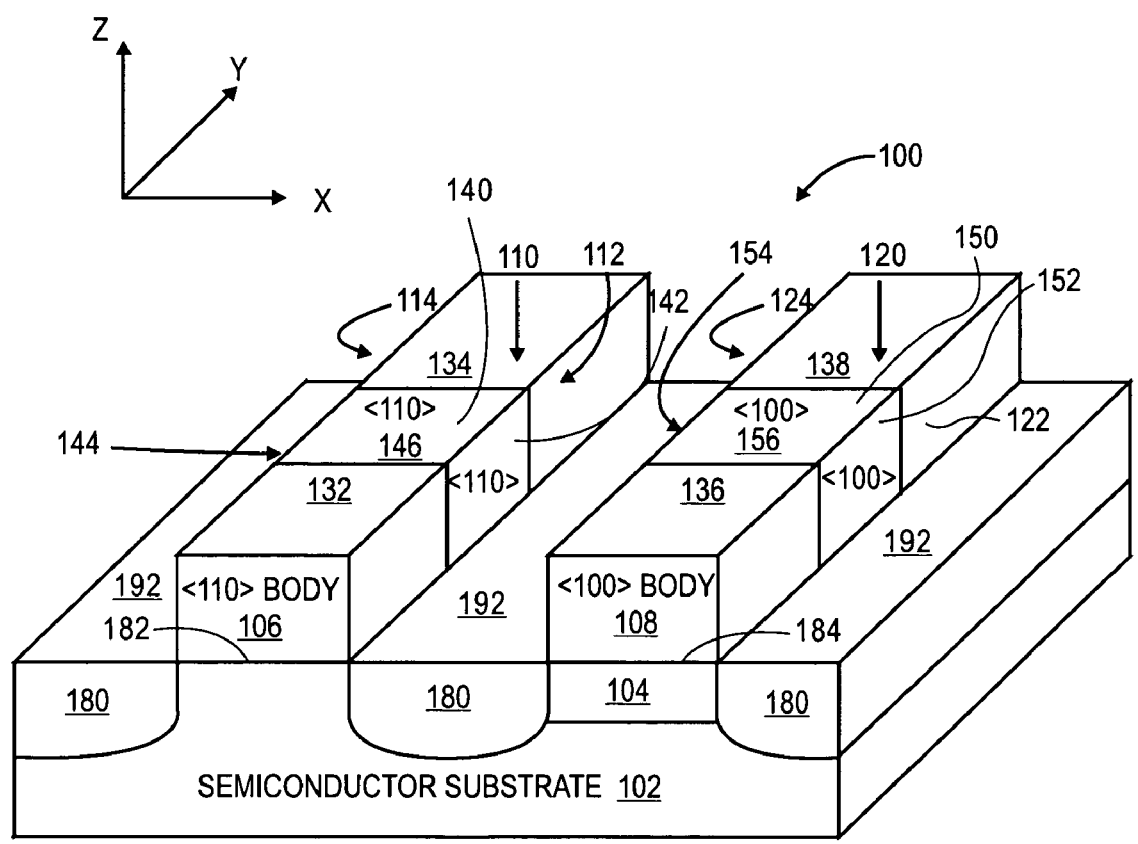
FIG. 2C is a perspective view that illustrates the different crystal orientations of the bodies of the device layer of the substrate in more detail.

FIG. 2A is a cross sectional side view that illustrates a semiconductor device 100 according to one embodiment of the present invention. FIG. 2B is a perspective view that illustrates the semiconductor device 100 of one embodiment of the present invention. FIG. 2C is a perspective view that illustrates the different crystal orientations of the bodies of the device layer of the substrate in more detail.

In an embodiment, the device 100 may include a device layer of or on a substrate, where the device layer has tri-gate transistors with multiple different crystal orientations. In other words, the device layer has different crystal orientation is on, in, or at portions of the substrate defined from a top perspective. In some embodiments, more than one tri-gate transistors may be on each portion. It is also considered that the device layer for one or both portions may extend below the tri-gate body, such as where each of the tri-gate transistors may have the same or similar crystal orientations as the portion of the substrate it is on. Thus, each of bodies 106 and 108 may be described as "device layers", such as bodies or layers where, on, or in which a device will be or is formed (e.g., tri-gate devices, channels, sources, and/or drains thereof). In some cases, the combination of bodies 106 and 108 (and/or gate electrode 130) may be described as a single "device layer" (e.g., for a single CMOS device). In other cases, each of bodies 106 and 108 having a device may be described as separate "device layers" (e.g., for separate PMOS and NMOS devices).

The substrate of device 100 may be defined as substrate 102 having one (e.g., a single) crystal orientation, isolation regions 180, layer 104 having a same crystal orientation as substrate 102. Layer 104 may have had a different (e.g., a different single) crystal orientation than substrate 102, such as by having the same crystal orientation as body 106, prior to a high energy ion implantation to amorphize, then anneal/recrystallization to form layer 104 having a same crystal orientation as substrate 102. Also, substrate 102 may be described as including isolation regions 180 and/or layer 104, such as where regions 180 and/or layer 104 are considered formed in or on substrate 102. A similar concept may apply to body 106, body 108, and gate electrode 130 being included as part of substrate 102, such as where they are considered formed in or on substrate 102. In some cases, substrate 102 may be described as a substrate and layer 104 may be a layer formed in or on substrate 102 (e.g., where tri-gate transistors 160, 170 having different crystal orientations are formed on semiconductor substrate 102, and layer 104 is a layer or part of the substrate).

Also show is gate electrode 130 formed on, above, over and/or surrounding bodies 106, 108 (e.g., on three sides of each body). Also shown is surface 182 of substrate 102, such as a surface on which body 106 and/or electrode 130 is disposed or formed. Similarly, layer 104 is shown under body 108 on the opposite of one of isolation regions 180 from body 106. Layer 104 is shown having surface 184, such as a surface on which body 108 and electrode 130 are disposed or formed. Layer 104 may be of a similar semiconductor material and/or have the same (or a similar) crystal orientation as body 108. Likewise, layer 104 may be of a similar semiconductor material and/or have the same (or a similar) crystal orientation as substrate 102. Substrate 102 may be of a similar semiconductor material and/or have a different (or a non-similar) crystal orientation as body 106.

According to embodiments, the material above and below surfaces 182 and 184 may be the same or different material and may have the same or different crystal orientation along two orthogonal or perpendicular planes. For instance, the material above (e.g., material of or within body 106) and below (e.g., material of or within substrate 102) surface 182 may be the same or different semiconductor material and may have the different crystal orientations along at least the $\overline{xy}$ and $\overline{zy}$ planes. In addition, the material above (e.g., material of or within body 108) and below (e.g., material of or within layer 104) surface 184 may be the same semiconductor material and may have the same crystal orientations along at least the $\overline{xy}$ and $\overline{zy}$ planes.

Substrate 102 may have a <100> crystal orientation along surface 182, and layer 104 may have a <100> crystal orientation along surface 184. In addition to those orientations, substrate 102 and layer 104 may have a <100> crystal orientation along a plane parallel to sidewalls 122 and 124, and along a plane parallel to top 120. In some cases, substrate 102 and layer 104 may have a <100> crystal orientation along a plane parallel to sidewalls 112 and 114, and along a plane parallel to top 110.

FIGS. 2A-2C show isolation regions 180 formed along the top surface of substrate 102 and/or layer 104. For instance, regions 180 are formed adjacent or beside sidewalls 112, 114, 122, and 124, extending downward through a thickness of substrate 102 sufficiently to electronically isolate from body 106 from body 108 to function as separate as electronic devices as described herein. Isolation regions 180 may be described as trench isolation or shallow trench isolation (STI), such as regions of dielectric material, oxide material, semiconductor oxide material, or other insulator material formed in or on substrate 102 and/or layer 104. In some cases, isolation regions 180 may be formed by etching a trench or via in substrate 102 and filling the trench or via with insulator material (e.g., such as by using one or more processes to grow or deposit the insulator material in all the trenches). Alternatively, isolation 180 may be formed by oxidizing, doping, or otherwise changing a portion of substrate 102 from a semiconductor to an insulator material. Thus, the devices (e.g., bodies 106 and 108) are isolated from each other, but are not electrically isolated from substrate 102 and/or layer 104. Although transistors 160, 170 may include portions of the device layer of the substrate (in the form of bodies 106, 108), the transistors 160, 170 may still considered to be "on" the substrate.

Moreover, FIGS. 2A-2C show surfaces 192 formed from or on regions 180. Surfaces 192 may be parallel with, planar with and/or level with surface 182 and/or 184. Surface 182 may be defined or described as a planar region or shape within substrate 102 parallel with, planar with and/or level with any of surfaces 192. Similarly, surface 184 may be defined or described as a planar region or shape within layer 104 parallel with, planar with and/or level with any of surfaces 192.

One or more devices may be formed on each of substrate 102 and layer 104. The devices have the same or different crystal orientation as substrate 102 or layer 104 on which they are formed. In the embodiment shown in FIGS. 2A-2C, two tri-gate transistors 160, 170 (one PMOS 160 and one NMOS 170) are formed on semiconductor substrate 102 and layer 104 respectively. As shown, transistor 160 may have a <110> crystal orientation at, on, along or over surface 182, a plane parallel to any of surfaces 192, and/or top 110. Similarly, transistor 170 may have a <100> crystal orientation along or over surface 184, a plane parallel to any of surfaces 192, and/or top 120. In addition to those orientations, transistor 160 may have a <110> crystal orientation along sidewalls 112 and 114; and transistor 170 may have a <100> crystal orientation along sidewalls 122 and 124. Alternatively, transistors 160 and 170 may have different crystal orientations along the surfaces and planes noted above (e.g., where transistor 160 has another different crystal orientation than transistor 170), such as where transistor 160 has a <100> crystal orientation along the surfaces and planes noted above, and transistor 170 has a <110> crystal orientation along the surfaces and planes noted above.

Each of tri-gate transistors 160, 170 includes a silicon body 106, 108 formed on a single crystal silicon semiconductor substrate 102 and layer 104, respectively. Bodies 106, 108 of the illustrated embodiment are in the form of fins defined from the silicon device layers of the substrate. A gate dielectric layer (not shown) is formed on the top 110, 120 and sidewalls 112, 114, 122, 124 of the silicon bodies 106, 108, between the bodies 106, 108 and gate electrode 130. The gate dielectric may be one or more thin layers of material (e.g., equal to or thinner than thickness T2), where each layer is or includes an insulator material and/or a dielectric material. A continuous gate dielectric may be formed over both body 106 and 108. Alternatively, separate gate dielectrics may be formed over each of body 106 and 108. The separate gate dielectrics may each include similar or different numbers of layers, thicknesses of layers, and types of material included in the layers. Gate electrode 130 is formed on the gate dielectric layer and surrounds the bodies 106, 108 on three sides. The gate electrode 130 essentially provides transistors 160, 170 with three gate electrodes, one on each of the sidewalls 112, 114, 122, 124 of the silicon bodies 106, 108 and one on the top surfaces 110, 120 of the silicon bodies 106, 108. Sidewall 114 and 124 may be described as a "left" sidewall, and sidewall 112 and 122 may be described as a "right" sidewall. It can be appreciated that the use of "left" and "right" is relative regarding the walls comparative orientations and may be omitted or reversed when describing silicon body 106 and 108.

As shown in FIGS. 2B and 2C, source regions 132, 136 and drain regions 134, 138 are formed in silicon bodies 106, 108 on opposite sides of gate electrode 130, as shown in FIGS. 2B and 2C. Active channel region 146 may be the region of silicon body 106 located beneath gate electrode 130 and between source region 132 and drain region 134. Similarly, active channel region 156 may be the region of silicon body 108 located beneath gate electrode 130 and between source region 136 and drain region 138. Since body 106 may be part of a PMOS device, source region 132 and drain region 134 may be doped as p-type material while channel region 146 is doped as n-type material. The region of gate electrode 130 around channel region 146 may also be doped as p-type material (although a gate dielectric between gate electrode 130 and channel region 146 may or may not be doped as p or n-type material). Correspondingly, since body 108 may be part of an NMOS device, source region 136 and drain region 138 may be doped as n-type material while channel region 156 is doped as p-type material. The region of gate electrode 130 around channel region 156 may also be doped as n-type material (although a gate dielectric between gate electrode 130 and channel region 156 may or may not be doped as p or n-type material).

As shown in the illustrated embodiment, the PMOS transistor 160 may be formed with a body 106 having a <110> crystal orientation and the NMOS transistor 170 may be formed with a body 108 having a <100> crystal orientation. Specifically, substrate 102 may have a crystal orientation of <100>, which is different along at least one surface or sidewall than the <110> crystal orientation of body 106. Layer 104 may have a crystal orientation of <100>, which is the same or equal along at least the top surface and both sidewalls as the <100> crystal orientation of body 108. In the illustrated embodiment, the different crystal orientations are <100> and <110>, although other orientations may be present in other embodiments.

Semiconductor substrate 102 may be a silicon substrate, such as single crystal silicon or different type of semiconductor material (e.g., silicon germanium or gallium arsenide), or a combination of materials. Similarly, layer 104, body 106, body 108, and/or electrode 130 may be or include a single crystal silicon or different type of semiconductor material (e.g., silicon germanium or gallium arsenide), or a combination of materials. In some embodiments, substrate 102 may be considered a semiconductor "bulk" layer, such as where isolation regions are required to electrically isolate electronic devices formed in or on substrate 102. Thus, the bodies 106, 108 may be considered portions of a device layer, and may comprise single crystal silicon. In combination, the semiconductor substrate 102 and device layer may be considered a semiconductor on "bulk" layer device, where each device (e.g., transistor devices 160 and 170 formed in or on substrate 102 and layer 104) may be isolated electrically from other devices on the substrate by an isolation region, trench isolation, and/or shallow trench isolation (STI) extending down from the surface of substrate 102 and through a thickness of the substrate, between the devices.

For instance, FIG. 2A shows isolation regions 180 formed along the top surface of substrate 102 between body 106 and body 108, extending downward through a thickness of substrate 102 sufficiently to electronically isolate from body 106 from body 108 to function as separate as electronic devices as described herein. Thus, the devices (e.g., bodies 106 and 108) are isolated from each other, but are not electrically isolated from substrate 102. Although transistors 160, 170 may include portions of the device layer of the substrate (in the form of bodies 106, 108), the transistors 160, 170 may still considered to be "on" the substrate.

Alternatively, in other embodiments, substrate 102 may be a semiconductor on insulator (SOI) substrate, such as where an insulator layer (not shown) may be disposed between substrate 102 and bodies 106 and 108. The insulator layer may be a layer of oxide, such as silicon oxide, or another type of insulating, oxide, semiconductor and oxide, and/or dielectric material. Also, in some cases, substrate 102 may be a layer of crystal semiconductor of a substrate having a lower layer of amorphous semiconductor material below substrate 102.

FIG. 2C is a perspective view that illustrates the different crystal orientations of the bodies 106, 108 of the device layer of the substrate in more detail. Specifically, FIG. 2C shows channel region 146 including top surface 140, such as a planar surface having crystal orientation <110> along its surface; left side surface 144, such as a planar surface having crystal orientation <110> along its surface; and right side surface 142, such as a planar surface having crystal orientation <110> along its surface. Similarly, channel region 156 is shown having top surface 150, such as a planar surface having crystal orientation <100> along its surface; left side surface 154, such as a planar surface having crystal orientation <100> along its surface, and right side surface 152, such as a planar surface having crystal orientation <100> along its surface. Thus, bodies 106 and 108 may be described as parallel, such as where surfaces 140 and 150 are parallel, surfaces 144 and 154 are parallel, and or surfaces 142 and 152 are parallel. It can be appreciated, that these crystal orientations may extend through to the source and drain regions. It is also noted that the source and drain regions described herein may be described as "junction" regions, such as a region having a junction to another type of semi conductor, such as a junction between a p-type, n-type, or i (intrinsic-type) semiconductor materials. Alternatively, the source and drain regions described herein may be described as "diffusion" regions, such as regions doped with an impurity to make them p-type, n-type, or non i-type regions.

In the embodiment illustrated in FIG. 2C, body 106 is a <110> fin where each of the top 110 and sidewalls 112, 114 has a <110> crystal orientation. Thus, the top 110 surface of body 106 has a <110> plane which lies in the $\overline{xy}$ plane with a normal axis in the z direction. Similarly, the sidewall 112 of body 106 has a <110> plane which lies in the $\overline{zy}$ plane with a normal axis in the x direction, as does the sidewall 114. Having all three sides of the tri-gate channel of the transistor 160 with this <110> crystal orientation allows for increased mobility of holes and high performance of the p-type transistor 160. On the other hand, body 108 is a <100> fin where each of the top 120 and sidewalls 122, 124 has a <100> crystal orientation. Thus, the top 120 surface of body 108 has a <100> plane, which lies in the $\overline{xy}$ plane with a normal axis in the z direction. Similarly, the sidewall 122 of body 108 has a <100> plane, which lies in the $\overline{zy}$ plane with a normal axis in the x direction, as does the sidewall 124. Having all three sides of the tri-gate channel of the transistor 170 with this <100> crystal orientation allows for increased mobility of electrons and high performance of the n-type transistor 170.

Gate electrode 130 for bodies 106 and 108 may be described as a gate structure having a surface touching or in electrical contact with (such as to bias electrically with a positive or negatively voltage, thereby creating a channel field) surfaces 140, 142, and 144 of body 106 (e.g., those surfaces of the channel region of body 106) and surfaces 150, 152, and 154 of body 108 (e.g., such as to bias those surfaces of the channel region of body 108). For example, rather than a single electrode 130 on two bodies 106, 108, each body 106, 108 may have a separate gate electrode. Specifically, one gate electrode or structure may have a surface touching or in electrical contact with (such as to bias electrically with a positive or negatively voltage, thereby creating a channel field) surfaces 140, 142, and 144 of body 106 (e.g., those surfaces of the channel region of body 106), while another separate gate electrode or structure has a surface touching or in electrical contact with (such as to bias electrically with a positive or negatively voltage, thereby creating a channel field) surfaces 150, 152, and 154 of body 108 (e.g., such as to bias those surfaces of the channel region of body 108). Thus, these surfaces of channel regions 146 and 156 may be biased together (e.g., such as by electrode 130 as shown in FIG. 2B) or separately (e.g., such as where a separate gate electrode is used to bias the surfaces of regions 146 and 156 separately).

Gate electrode 130 may be one or more layers of material, wherein each layer is or includes a semiconductor material, a poly-silicon material, and/or a metal. Each layer may be doped or non-doped similarly to or differently than another layer. Gate electrode 130 may be or include a single layer of poly-silicon or dual metal layers (e.g., layer of different metal touching each other). For, separate gate electrodes formed over each of body 106 and 108, the separate gate dielectrics may each include similar or different numbers of layers, thicknesses of layers, and types of material included in the layers. The separate gate electrodes may each include similar or different doped or non-doped layers. Separate gate electrodes may be or include a p-type or n-type doped semiconductor (e.g., poly-silicon) or single metal layer.

FIG. 2A also shows thickness T1, such as a thickness or height of body 106, the material having a crystal orientation <110> of body 106, body 108, and/or the material having crystal orientation <100> of body 108. For instance, thickness T1, may be a thickness or height of body 106 and the material having a crystal orientation <110> of body 106. It may also be the thickness of body 108, and/or the material having crystal orientation <100> of body 108.

In another example, thickness T1 may be a thickness or height of body 106, but the material having a crystal orientation <110> of body 106 may have a thickness or height that is less than, or greater than that of T1. For instance, material having a crystal orientation <110> may extend below surface 182 of substrate 102 and/or 184 of layer 104. The material may also extend below surface 182 across 182 until it reaches isolation regions 180. If the material having crystal orientation <110> of body 106 has a thickness or height that is greater than T1, then it can be appreciated that the benefit of the crystal orientation of the material having crystal orientation <110> of body 108 will provide approximately the same benefit (e.g., same charge carrier mobility, drive current and/or performance) for PMOS transistor 160 than if the material had a thickness of T1. This calculation consider that the tri-gate structure allows carrier mobility along sidewalls 112 and 114 as well as top 110, but would not be effected by surface 182 being a material having crystal orientation <110>.

Alternatively, if the material having crystal orientation <110> of body 106 has a thickness or height that is less than T1, then it can be appreciated that the benefit of the crystal orientation of the material having crystal orientation <110> of body 108 will provide less benefit (e.g., less charge carrier mobility, drive current and/or performance) for PMOS transistor 160 than if the material had a thickness of T1. The decrease in performance may be approximately equal to (twice the amount of thickness of body 106 not having the material having crystal orientation <110> divided by three times T1) multiplied by the benefit of using the material having crystal orientation <110> as opposed to the material of body 108 or layer 104. It is three times T1 presuming the width of body 106 (e.g., between sidewalls 112 and 114) is equal to height T1. If not, then three times T1 can be changed to twice T1 plus the width of body 106. These calculations consider that the tri-gate structure allows carrier mobility along sidewalls 112 and 114 as well as top 110. Similar concepts to those above apply if the material having crystal orientation <100> of body 108 has a thickness or height that is less than, equal to, or greater than T1 (e.g., the thickness of body 108).

FIG. 2A also shows a thickness T2, such as a thickness of layer 104 below surface 182 of substrate 102, below surface 184, and/or below body 108. Layer 104 may be a layer having crystal orientation <100>. In some cases, layer 104 may have the same material and crystal orientation as body 108.

Having the same crystal orientation, may describe where the crystal orientation is the same or parallel for two materials in all directions. For example, having the same crystal orientation may describe where all parallel or same oriented surface, planar surface, or cross section of one material will have the same crystal orientation as that of the other material. Specifically, no matter which direction you slice the materials in, the surface resulting from the slice will have the same crystal orientation for both materials. Thus, each of such parallel surfaces may be described as having parallel orientations. Also, on a lesser level having the same crystal orientation may describe where any one, two, or three parallel or same oriented surface, planar surface, or cross section of one material will have the same crystal orientation as that of the other material (e.g., however other surfaces may of the one material may not have the same crystal orientation as that of the other material).

For example, as shown in FIG. 2C, for surfaces 140, 142, and 144; or surfaces 150, 152 and 154, any one of those surfaces may be described as having a crystal orientation in parallel with the other surfaces, because each of those surfaces has the same crystal orientation. Although, in some cases, this parallel crystal orientation may or may not also include other surfaces sliced from body 106 or body 108. Thus, the three surfaces, as shown, may have parallel crystal orientation, but other surfaces may not necessarily have the same crystal orientation as those surfaces. For example, the "face" surface of body 106 and body 108 shown parallel to the surface of the paper of FIG. 2A may not necessarily have crystal orientations <110> and <100>, respectively.

Thus, surfaces 140, 142, and 144 of body 106 may define or describe a "tri-gate" structure. Similarly, surfaces 150, 152, and 154 may define or describe a tri-gate structure for body 108. The tri-gate structure may be described as a structure having three gate surfaces and/or three channel surfaces, such as three channel surfaces to be biased by three surfaces of a gate to allow carrier mobility across three channels (e.g., to/from three source/drain surfaces of source regions 132, 136 and drain regions 134, 138). Each channel may be defined as the channel surfaces and material below the channel surfaces between source/drain surfaces and material below the source/drain surfaces. Since most of the carriers of a channel move along the surface, one benefit of a tri-gate structure is that conduction or carrier mobility along three surfaces is greater than it would be for a channel with only one, or two surfaces. In some instances, the carrier mobility for a tri-gate structure may increase performance by approximately doubling or tripling the current per unit width measured (e.g., width across the top surface between sidewalls of such a device) carrier mobility as compared to a planar device having only one channel surface (e.g., for the same width top surface, conduction along and below the side surfaces adds another one to two times the carrier mobility provided along and below the top surface). For instance, mobility may be increased by as much as 2× for electrons or holes in NMOS or PMOS devices respectively, for a tri-gate structure (e.g., having 3 channel surfaces) as compared to a single channel surface device.

Specifically, body 106 may be part of PMOS device while body 108 is part of a NMOS device. Thus, due to the <100> crystal orientation of or at surfaces 150, 152, and 154 of the NMOS device, and the <110> crystal orientation of surfaces 140, 142, and 144 of the PMOS device, carrier mobility and or drive current for either or both of those devices may be increased, such as by being increased by at least approximately 5, 10, 15, a number there between, or a range between any of those numbers in percent (%) percent for each channel surface of the structure. In some instances, the carrier mobility for a tri-gate structure may be increased by approximately doubling or tripling the current per unit width measured (e.g., width across the top surface between sidewalls of such a device) carrier mobility as compared to a planar device having only one channel surface. For instance, mobility may be increased by as much as 2× for electrons or holes in NMOS or PMOS devices respectively, due to the change in crystal orientation from <110> to <100> for surfaces 150, 152, and 154 of the NMOS and from <100> to <110> for surfaces 140, 142, and 144 of the PMOS.

According to embodiments, various crystal orientations, in addition to those described above, may be used for surfaces 140, 142, 144, and or 150, 152 and 154. For example, Table 1 shows various contemplated crystal orientations contemplated for any or all of the surfaces of the channel. The crystal orientations of Table 1 are example, but not limitation to those that can be used for the <100> and <110> orientation examples provided herein. Specifically, the concepts herein may be applied where <211>, <311>, <511>, <711> orientations and/or Miller Indices thereof (e.g., <101>, <011>, <001>, <111>, <-1-10>, <0-1-1>, <-10-1>, <-110>, ... <-111>, <1-11>, <11-1>) are used instead of the <100> and <110> orientation examples.

TABLE 1

| Notch Rotation | $\overline{xy}$ plane/ $\overline{zy}$ plane | NMOS TOP | NMOS Side 1 (e.g., left side) | NMOS Side 2 (e.g., right side) | PMOS TOP | PMOS Side 1 (e.g., left side) | PMOS Side 2 (e.g., right side) |
|---|---|---|---|---|---|---|---|
| Standard | (100)/[110] | (100) | (110) | (110) | (100) | (110) | (110) |
| 45° Rotated Standard | (100)/[100] | (100) | (100) | (100) | (100) | (100) | (100) |
| (110) | (110)/[110] | (110) | (110) | (110) | (110) | (110) | (110) |
| 45° Rotated (110) | (110)/[100] | (110) | (100) | (110) | (110) | (100) | (100) |
| Dual Orientation | mixed | (100) | (100) | (100) | (110) | (110) | (110) |

Note that the "$\overline{xy}$ plane/$\overline{zy}$ plane" shows crystal orientation in those planes as shown in FIGS. 2B-C, such as in planes with a normal axis in the z direction and x direction respectively. The NMOS and PMOS "TOP" may correspond to the plane of top 120 and 110 respectively. The NMOS and PMOS "Side 1", "Side 2" may correspond to the plane of sidewalls 124, 122, 114, and 112 respectively. Also, "Notch Rotation" may be an orientation of a wafer, such as indexed by a notch on the wafer surface or edge to define a radial orientation (e.g., out of a 360 degree rotation). For a single crystal material (e.g., substrate 102) a Notch Rotation of zero degrees or "Standard" for the table below defines a crystal orientation of <100> along the $\overline{xy}$ plane normal to the Z-axis (e.g., along surface 182 or 110), and of <110> along the $\overline{zy}$ plane normal to the X-axis (e.g., along surface 144 or 142). Thus, body 106 has 45° Rotated Standard notch rotation. However, as shown in the table, this leads to <100> crystal orientation for surfaces of body 108, unless a dual-orientation structure (see lowest column of Table 1), such as described herein, is formed.

FIGS. 3 through 10 are cross sectional side views that illustrate how a substrate with portions (which may also referred to as regions) of the top semiconductor layer (also referred to as the device layer) having different crystal orientations may be made according to one embodiment. FIG. 3A is a cross sectional side view that illustrates a substrate with a device layer having a <100> crystal orientation according to one embodiment. The substrate may be or include a semiconductor substrate 102 (also referred to as a base layer of semiconductor material), which may comprise silicon or another semiconductor material or combination of materials. Also, as noted above, substrate 102 may be a SOI including an insulating layer disposed between an upper layer of substrate 102 having <100> crystal orientation and a lower layer of substrate semiconductor material. The insulator layer may be a layer of oxide, such as silicon oxide, or another type of insulating material, and may also be known as a buried oxide layer. Also, in some cases, substrate 102 may be a layer of crystal semiconductor of a substrate having a lower layer of amorphous semiconductor material below substrate 102.

Figure 3A:
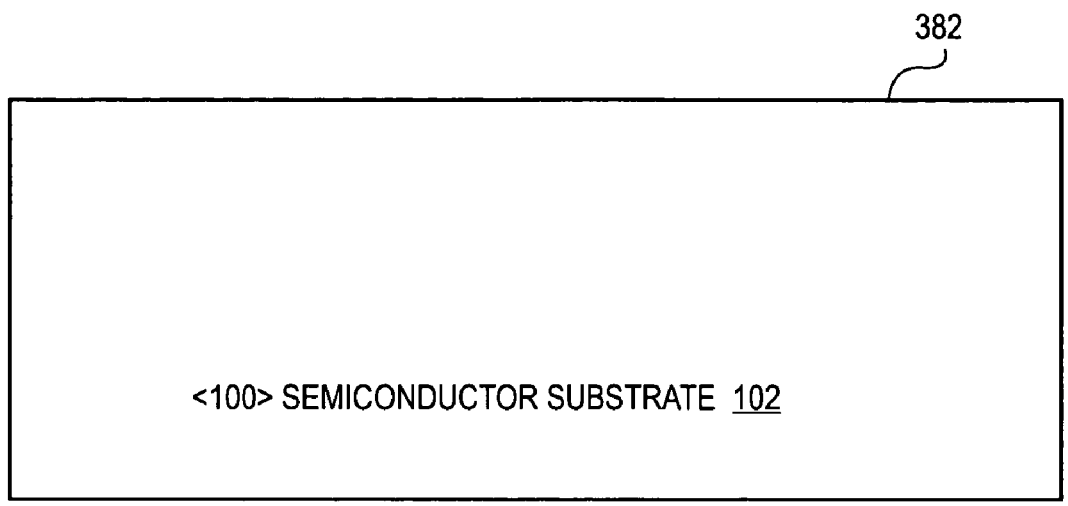
FIG. 3A is a cross sectional side view that illustrates a substrate with a device layer having a <100> crystal orientation.
Figure 3B:
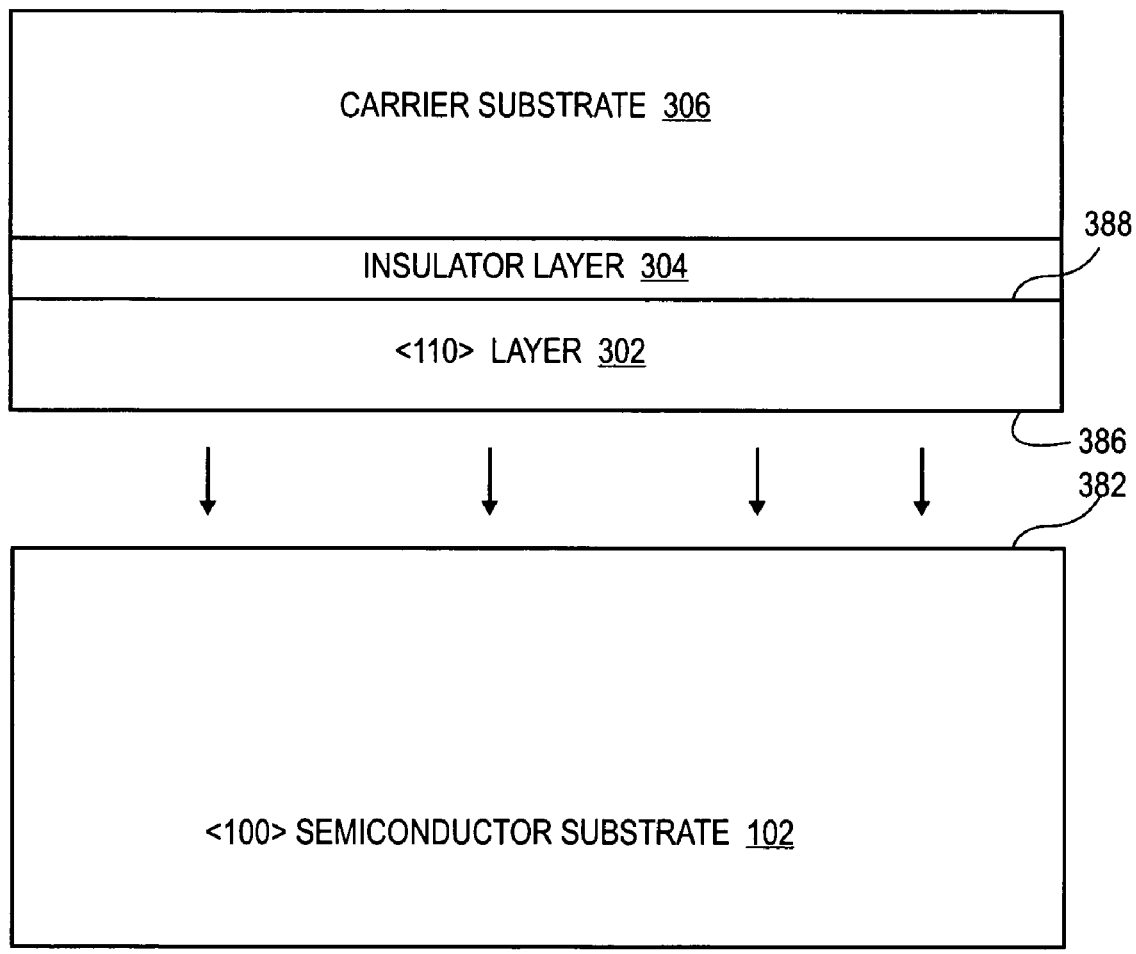
FIG. 3B is a cross sectional side view that illustrates a second substrate with a device layer having a <110> crystal orientation according to one embodiment.

FIG. 3B is a cross sectional side view that illustrates a second substrate with a device layer having a <110> crystal orientation according to one embodiment. As noted, substrate 102 may have a crystal orientation similar to that described above for layer 104 and body 108, such as where the crystal orientation is <100> along surface 382 and side surfaces as shown in FIG. 3B which are parallel planes to surfaces 150, 152 and 154 of FIG. 2C. In the illustrated embodiment, substrate 102 has a <100> crystal orientation along these surfaces (with a top surface 382 having a <100> plane with a normal axis pointing down in FIG. 3A), although other embodiments substrate 102 may have another crystal orientation, such as an orientation chosen for a transistor of device 100 as noted for FIG. 2, or shown in Table 1. Similarly, layer 302 may have a crystal orientation similar to that described above for body 106, such as where the crystal orientation of layer 302 is <110> along surface 388 and side surfaces as shown in FIG. 3B which are parallel planes to surfaces 140, 142 and 144 of FIG. 2C. In the illustrated embodiment, layer 302 has a <110> crystal orientation along these surfaces (with a bottom surface 386 having a <110> plane with a normal axis pointing up in FIG. 3A), although other embodiments layer 302 may have another crystal orientation, such as an orientation chosen for a transistor of device 100 as noted for FIG. 2, or shown in Table 1. Layer 302 and substrate 102 have different crystal orientation along at least one plane.

It is also contemplated that substrate 102, layer 302, and substrate 306 may comprise similar or different semiconductor materials. For example, substrate 102, layer 302, and/or substrate 306 may be or include silicon, germanium, gallium, or arsenide. Also, the layers may have various concentrations of dopants and/or semiconductors. For example, substrate 102 may be silicon with different concentrations of germanium (e.g., may have a graded SiGe layer under surface 382). A similar concept applies to layer 302 and substrate 306 with, or without, layer 304. In some embodiments, both of substrate 102 and device layer 302 may comprise single crystal silicon, although in other embodiments they may comprise other materials.

For example, a <110> crystal orientation of layer 302 may exist along the $\overline{xy}$ plane normal to the Z-axis and along the $\overline{zy}$ plane normal to the X-axis. Similarly, a <100> crystal orientation of substrate 102 may exist along the $\overline{xy}$ plane normal to the Z-axis and along the $\overline{zy}$ plane normal to the X-axis. Thus, those crystal orientations of layer 302 and substrate 102 may be described as parallel along those planes. For example, in an embodiment, the crystal orientation of the device layer 302 may be chosen to be the crystal orientation desired to be present in the final device 100 and not present in substrate 102. In another embodiment, substrate 102 may have a <110> crystal orientation along those planes and device layer 302 may have a <100> crystal orientation along those planes. In yet other embodiments, different crystal orientations may be chosen for those planes for substrate 102 and device layer 302, to result in a substrate having a device or top semiconductor layer with different portions or regions with different desired crystal orientations.

The arrows of FIG. 3B indicate the second substrate 306 being brought into contact with the <100> substrate 102. Specifically, surface 386 of layer 302 of the SOI substrate 306 is being brought into contact to touch surface 382 of substrate 102. The SOI substrate may include a carrier substrate 306, which may comprise silicon or another semiconductor material or combination of materials. An insulator layer 304 may be a layer of oxide, such as silicon oxide, or another type of insulating material, and may also be known as a buried oxide layer. The device layer 302 of the SOI substrate may comprise silicon or another semiconductor material or combination of materials. In some cases, layer 302 will not be part of a SOI substrate, but may be part of a bulk substrate such as that described for substrate 102 (e.g., where layer 304 does not exist and substrate 306 and layer 302 are both material as described for layer 302).

The substrates and layers of FIG. 3B may be part of a wafer such as a wafer having substantially circular shaped top and bottom surfaces and a diameter greater than about 200 mm or a diameter greater than or equal to about 300 mm. Other shapes and sizes of wafers are also contemplated. Thus, the devices and structures of FIG. 2 may be singulated or diced from wafers formed as shown in FIGS. 2-11, such as is done to form a microprocessor die singulated from a wafer having a substantially square or rectangular shape.

In some embodiments, the semiconductor layer 302 with a first crystal orientation may be directly bonded to (e.g., to touch and/or be attached to) surface 382 of semiconductor substrate 102 with a second crystal orientation. Prior to bonding, both wafers (e.g., surfaces 386 and 382) may be first prepared with cleaning, surface activation or growth of bonding layer to facilitate high strength-void free bonding. In some embodiments, the correct surface activation can be achieved by hydrophobic, hydrophilic, direct surface states or other processes. Any treatment that results in such termination may be used. In an embodiment, the substrates may be cleaned with HF prior to bonding. Following the bonding, a high temperature anneal may be used to strengthen the bond interface (e.g., surface 386 to surface 384) may be carried out at temperatures ranging from 300 degrees Celsius to 1100 degrees Celsius. In an embodiment, the bonded substrates may be annealed at about 600 degrees Celsius.

Surface 386 may be bonded to surface 382 by various wafer bonding techniques including hydrophilic bonding, hydrophobic bonding, bonding including an oxide layer or not including any intervening layers between surface 386 and 382

(such as where 386 touches surface 382). In some embodiments, surface 382 is surface 182 as described for FIG. 2 and surface 386 is the bottom surface of the body 106. Also, surface 382 may be planar with surface 184. Alternatively, where the material of body 106 extends below surface 182, surfaces 382 and 386 will be the interface between the <110> crystal oriented material of body 106 and the <100> crystal oriented of substrate 102.

In some wafer bonding techniques hydrophilic bonding can be used. For example, a thick layer of oxide is formed on surface 386 of the SOI donor wafer. The oxide layer can be in the range from 300 Angstroms (Å) to 3000 Angstroms. The wafer surfaces are typically terminated in hydrophilic hydroxyl groups, such as Si—OH groups. Surface 386 of the SOI donor wafer is subsequently bonded to surface 382 of substrate 102 of the handle wafer by contacting the treated surfaces of the respective wafers (e.g., surfaces 386 and/or 382) to each other with heat applied thereto. Prior to bonding, one of the wafers is implanted with hydrogen to establish the 'breakline' for predetermined thickness of the top silicon portion of the bonded wafer. When the bonded wafer is treated with heat, the implanted hydrogen line breaks and thus a wafer with an imbedded thick oxide layer is formed. Thus, the result is a hybrid crystal orientation substrate with a thick oxide layer in between the respective crystal orientation layers.

Imbedded thick oxide bonding produces a wafer with imbedded isolation (buried oxide, or BOX) which may have different device characteristics than standard bulk silicon. It may require completely different circuit design. In addition, the interfacial oxide layer may act as an insulator and the resulting hybrid substrate has silicon-on-insulator (SOI) characteristics.

In some wafer bonding techniques hydrophobic bonding can be used. The process requires high temperatures and expensive equipment. For example, surface 382 of the handle wafer can be treated with hydrofluoric acid. Surface 386 of the SOI donor wafer can be implanted with hydrogen ions resulting in an implanted wafer. Before contacting the treated surfaces, the handle wafer must be subjected to a pre-anneal process to obtain a surface free of hydrogen (H) and hydroxyl (OH) groups. In some applications, the pre-anneal process is conducted at 650 degrees Celsius (° C.). Similar to the handle wafer, the implanted wafer must be processed by a krypton-fluoride excimer laser to obtain a surface substantially free of H and OH groups. Thereafter, the handle wafer and the implanted wafer can be contacted for wafer bonding. The result is a substrate, which may include layers of different crystal orientations formed by high temperature and laser treatment.

In some cases, oxide layers can be formed on one or both surfaces 386 and 382 of donor wafer and handle wafer (not shown). Examples of materials, which can be used for oxide layers, include but are not limited to, silicon dioxide ($SiO_2$), silicon nitride ($Si_3N_4$), plasma oxide and chemical oxide, or high-dielectric constant based oxides such as hafnium oxide. Oxide layer formation can be performed by a variety of processes, including, but not limited to, ambient native growth, chemical growth, chemical vapor deposition (CVD), RF sputtering, atomic layer deposition (ALD), low pressure CVD, plasma-enhanced CVD or any other suitable process. It should be appreciated that in some embodiments, an oxide layer can be formed on the donor wafer, the handle wafer or both wafers.

In some embodiments, ambient native growth forms the oxide layers. The donor wafer and handle wafer may first be cleaned by such processes including, but not limited to, wet-chemistry wafer cleaning processes. In some embodiments, hydrogen fluoride (HF) and hydrogen-peroxide-based wet cleans can be used. For example, dilute HF, Standard Clean-1 (SC-1) and Standard Clean-2 (SC-2) can be used sequentially on the wafers. The wafers can then be rinsed with deionized water with a resistivity of about 18 megaOhms centimeter. Subsequently, the cleaned donor wafer and handle wafer may be left in ambient conditions for approximately six hours to approximately thirty-six hours for saturated growth. Ambient conditions can be room temperature (approximately 21° C. to 23° C.) at approximately one atmosphere. Ambient native growth can result in an oxide layer of, for example, approximately 8 Angstroms to approximately 25 Angstroms.

In some embodiments, the donor wafer and handle wafer can be dipped in a solution for formation of the oxide layers. Examples of solutions include, but are not limited to, peroxide solutions, such as hydrogen peroxide ($H_2O_2$) solutions and SC1/SC2 solutions. The wafers can be stripped of any native oxide that has grown in ambient conditions. Thus, a cleaning process, such as the one described previously, can be performed before formation of chemical oxide layers. In one embodiment, the cleaned donor wafer and handle wafer may be dipped into a bath of 7% solution of hydrogen peroxide for a time from between 60 seconds and 600 seconds to form oxide layers. Dipping in peroxide can result in an oxide layer of, for example, approximately 15 Angstroms. In another embodiment, the cleaned donor wafer and handle wafer may be dipped into baths of SC1 and SC2 solutions for a time from between 60 seconds and 600 seconds to form oxide layers. Dipping in SC1/SC2 can result in an oxide layer of, for example, approximately 3 Angstroms.

In some embodiments, chemical vapor deposition forms oxide layers. The wafers can be stripped of any native oxide that has grown in ambient conditions. Thus, a cleaning process, such as the one described previously should be performed before formation of oxide layers. An example of a process to grow this oxide would involve annealing at about 900° C. of Si in a flow of oxygen or steam (wet oxidation) for approximately 30 to 100 seconds. This results in an oxide layer of, for example, from approximately 3 Angstroms to approximately 10 Angstroms.

After formation of the oxide layers, wafer (e.g., surface 386) can be brought into contact (e.g., to touch) with handle wafer (e.g., surface 382) by "flipping" the donor wafer onto the handle wafer (e.g., see FIG. 3B). Then the oxide layer of donor is in contact with the oxide layer of the handle wafer. Wafers are brought into contact to initiate bonding (contact bonding) as point bonding or full face bonding. "Point bonding" is when the bonding is initiated at a single point and the bonding wave propagates across the wafer. "Full face bonding" is when pressure is applied across the whole wafer at the same time to induce bonding. After placing the wafers in contact, a bond wave propagates until full bonding is achieved. Bond wave propagation occurs when two substances are put into contact with another at least one point. A wave initiates to seal the remaining points so that that the two substances are molecularly bonded by weak van der Waals forces. Bonding can be achieved from about 30 seconds to about 2 minutes. Bonding can be done under atmospheric conditions or vacuum conditions. At this point, weak molecular forces, i.e., van der Waals forces, hold the bonded donor wafer and handle wafer together resulting in a bonded substrate (e.g., see FIG. 4). Surface energy at the bonding interface may be about 0.1 Joules per meter squared ($J/m^2$).

In some embodiments, after contact bonding and bond wave propagation, a post-bonding anneal process can be applied to a resulting multi-layer substrate to convert the weak molecular forces to chemical covalent bonds. "Anneal" is a high temperature process which can be employed in, for example, semiconductor fabrication processes. In some embodiments, a post-bonding anneal process can be in a range from approximately 400° C. to approximately 1200° C. for a time period between about 2 hours to about 10 hours. Although bonding is achieved in contact bonding, strengthening bonding to form covalent bonds (such as by post-bonding anneal processes) may be further applied to the multi-layer substrate to strengthen the bond between the donor wafer and the handle wafer. After the post-bonding anneal process, the bond energy is increased to about 2.0 ($J/m^2$) and the multi-layer substrate may be subjected to further processing, such as grinding.

Thus, in this process, the multi-layer substrate includes ultra-thin oxide layer in a range from about 5 Angstroms to about 100 Angstroms, and more particularly, from about 5 Angstroms to about 50 Angstroms. In some embodiments, the oxide layer is approximately 5 Angstroms. Representative examples in which the oxide layer may be approximately 5 Angstroms include Logic transistor devices. In some embodiments, the oxide layer is approximately 15 Angstroms to 25 Angstroms. Representative examples in which the oxide layer may be approximately 15 to 50 Angstroms include floating body Memory transistor devices. During the post-anneal process, moisture or hydrogen can form water ($H_2O$) or hydrogen gas ($H_2$) which gets absorbed in the oxide layer, thus preventing formation of voids.

As part of or after hydrophobic bonding (i.e., direct bonding), a post hyphen bond anneal may cause Si—H to react with Si—H to form Si—Si and $H_2$ at the interface between the wafers. As a result, $H_2$ can become trapped forming voids between the two wafers. Alternatively, for hydrophilic bonding (i.e., bonding between the 2 wafers with an oxide layer disposed there between), a post bond anneal can cause Si—O to react with Si—O to form Si—O—Si. In these embodiments it is possible that these residual $H_2$ or $H_2O$ is substantially or completely absorbed in the off site interface. It is also noted that for the hydrophobic bonding, for surfaces having different crystal orientations, misfit dislocations are expected, while hydrophilic bonding, the oxide layer may accommodate crystal mismatches between different crystal oriented surfaces. Moreover, the layer of oxide is thin enough (e.g. between 5 angstroms and 25 angstroms) it is possible that the bonded materials will have electrical characteristics more similar to bulk semiconductor than to SOI substrates. For example, bulk substrate characteristics include, but are not limited to lack of floating body effects or self heating.

Figure 3C:
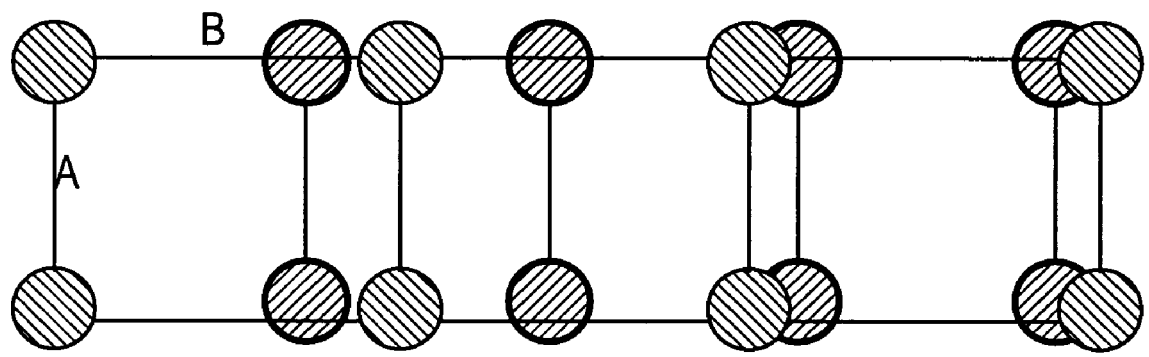
FIG. 3C illustrates an embodiment of lattice mismatch between two substrates with two different crystal orientations.

Also, the ultra-thin oxide layer can accommodate lattice mismatch between different crystal orientations. For example, bonding of <100> crystal orientation of surface 382 to <110> crystal orientation of surface 386 can result in a 40% mismatch. FIG. 3C illustrates an embodiment of lattice mismatch between two substrates with two different crystal orientations. That is, one out of every four atoms are mismatched at the interface between <100> silica and <110> silica, as shown in FIG. 3C. Thus, the ultra-thin oxide layer may be needed due to the anticipated high density of dislocation between atoms. The ultra-thin oxide layer allows the bonding for largely mismatched materials without formation of misfit or threading dislocations. "Misfit dislocation" refers to the mismatch between individual atoms of different crystal orientations. "Threading dislocation" refers to non-equilibrium defects that raise the free energy of a layer. Threading dislocations are deleterious for physical performance.

Figure 4:
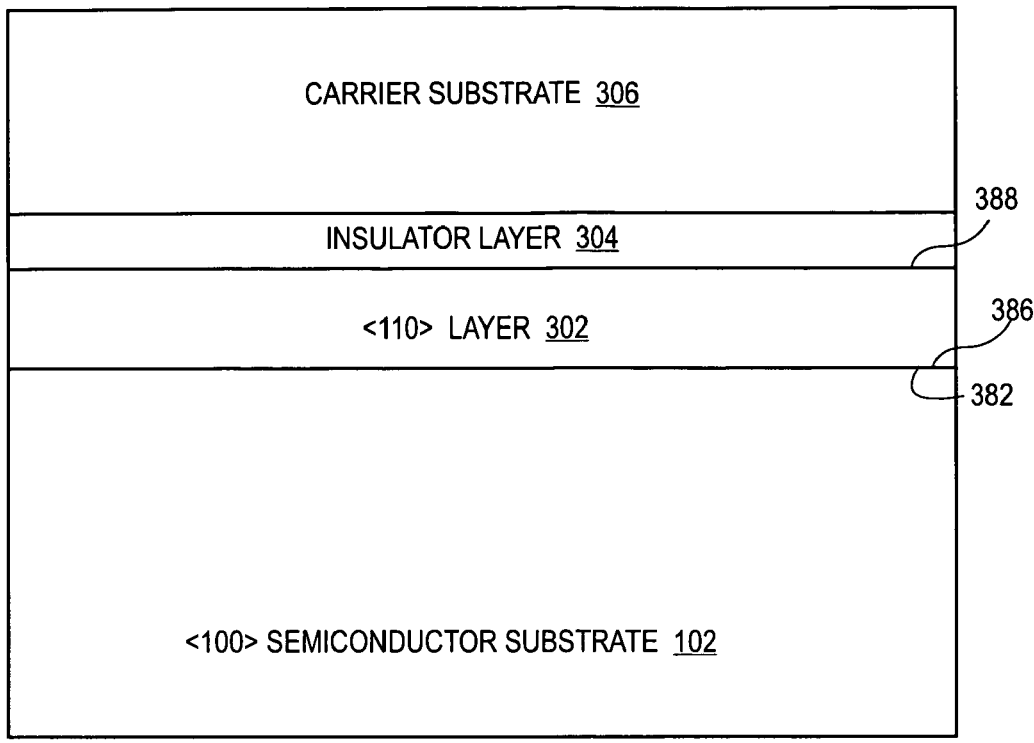
FIG. 4 is a cross sectional side view that illustrates the two substrates bonded together.

FIG. 4 is a cross sectional side view that illustrates the two substrates bonded together. In an embodiment where substrate 102 and device layer 302 comprise silicon, there may be a silicon-to-silicon bond connecting the two substrates. In other embodiments, such as embodiments where substrate 102 and device layer 302 comprise different materials, the bonding may be different. Various crystal orientations are contemplated for surface 386 and other planes of layer 302 bonded to surface 382 and other planes substrate 102, such as various different crystal orientations for the surfaces of body 106 and 108 described for FIG. 2, and described for Table 1.

Figure 5:
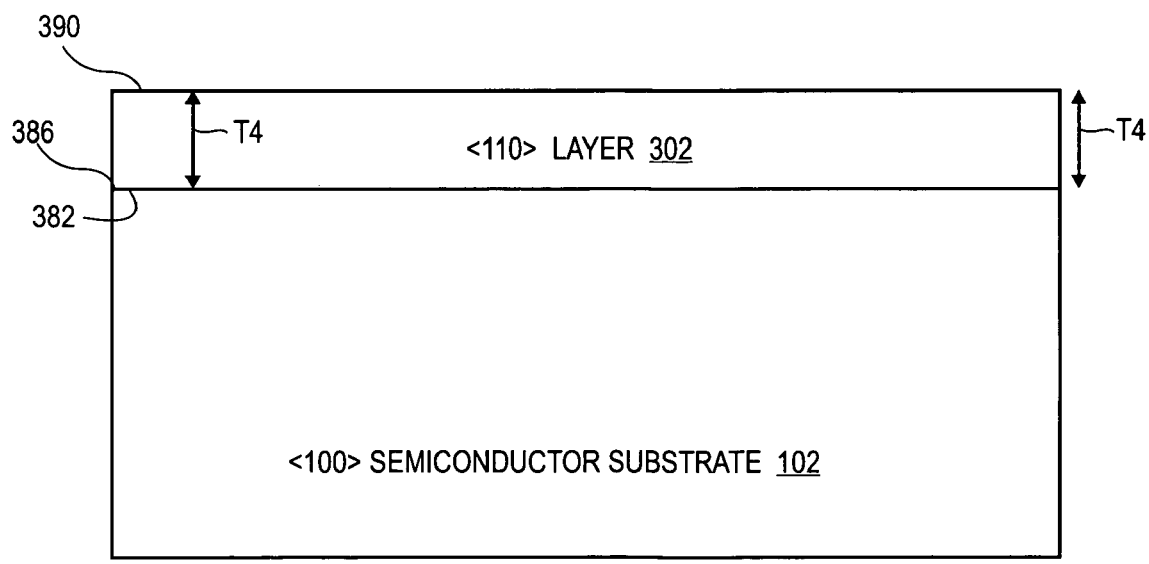
FIG. 5 is a cross sectional side view that illustrates the substrates after the carrier substrate and insulator layer have been removed, leaving a single substrate with two stacked device layers.

FIG. 5 is a cross sectional side view that illustrates the substrates after the carrier substrate 306 and insulator layer 304 have been removed, leaving a single substrate with two stacked layers having different crystal orientations. Specifically, layer 302 is on, attached to, bonded to, or touching substrate 102. Layer 302 and substrate 102 may be considered stacked "device layers", such as where one portion of layer 302 will become a device, and another portion of layer 302 will become a device after being subjected to a high energy ion implantation to amorphize, then anneal/re-crystallization to form a layer having a same crystal orientation as substrate 102. Surface 386 or 382 may or may not be the same surface as surface 182 (and planar with surface 184) of FIG. 2.

Carrier substrate 306 and insulator layer 304 may be removed by any suitable processes such as etching, grinding, and/or CMP to form surface 390 of layer 302 (e.g., having a <110> crystal orientation). Surface 390 may be below where surface 388 was, such as by a few micrometers or microns. For example, layer 304 may be an etched stop layer such that an etching process may be used to remove substrate 306, stopping at layers 304. Then a subsequent etch may be used to remove layer 304 such that surface 390 will become top 110 (and planar with top 120) of FIG. 2. Similarly, a grinding or polishing process may be used where layer 304 is a polished or grinding stop layer, so that substrate 306 may be removed by a grinding or polishing process stopping at layer 304. After polishing or grinding, layer 304 may be removed by a further thin layer of polish or grind, thereby etching away layer 304. Specifically, etching of substrate 306 can be done with an etching that is selective to etch the material of substrate 306 but not the material of layer 304. Likewise, etching of layer 304 may be done using an etchant that is selective to remove layer 304, but not the material of layer 302. The similar concept applies for polishing or grinding of the layers selected to remove one layer, without removing any or a substantial portion of another layer. For instance, an etch selective chemistry may be used to remove one material at a rate of at least 100 to 1000 times greater than it removes the material of another layer. A similar selectivity may apply to the grinding or polishing chemistry or process used to remove one material at a rate of at least 100 to 1000 times greater than it removes the material of another layer.

It can also be appreciated that any of the surfaces described herein, such as surfaces 382 and 386, may have voids, defects, pits, dislocations, such as between the crystal structure of the material above, and the material below the surface, such as to have a dislocation density at the surface of less than about $100/cm^2$ at the surface or in the material above and/or below the surface (e.g., see description regarding FIG. 3C. To minimize or reduce such dislocations or defects, in some cases a thickness of substrate 306 may be removed during a process prior to removing all of substrate 306. For example, a thickness of substrate 306 may be removed so that a remaining thickness of substrate 306 of 15, 20, 25, 30, or a range between any of those thicknesses in microns is left on layer 304. Leaving such a remaining thickness may allow avoidance of high dislocation density within layer 302, such as where the thickness of substrate 306 is ground or polished to leave the remaining thickness of substrate 306. Having a thickness at least as thick as that described above, because if layer 306 were ground to leave a thinner remaining layer, the mechanical stresses generated in or during the grinding or polishing process could cause a higher dislocation density within layer 302 or at the bonding surface between layer 302 and substrate 102 (e.g., at surfaces 382 and 386). Thus, the remaining thickness of substrate 306, and layer 304 may be removed by etching to reduce the amount of dislocations in layer 302 or at the bonding surface.

Moreover, a thickness of layer 302 may be removed during or after removing layer 304 by grinding, polishing, or etching, such that surface 390 is below surface 388. In certain embodiments, removal of a thickness of layer 302 by etching is preferred to reduce dislocation density in layer 302 or at bonding surfaces between layer 302 and substrate 102 (e.g., at surfaces 382 and 386). During removal of a thickness of layer 302, such as to leave remaining thickness T4 of layer 302, a polishing or etching process may be selected so that thickness T4 is highly uniform across or throughout layer 302, and/or surface 390 is substantially flat or planar. For example, the average thickness of thickness T4 may vary by 1, 2, 3, 5, or a range between any of those numbers in angstroms. Similarly, voids, pitting, or deviations in surface 390 may vary by ½, 1, 1½, 2 or a range between any of those numbers in angstroms. This etching and/or polishing may be performed initially or again as described for FIG. 10. Thickness T1 (e.g., see FIG. 2A) may be equal to or less than thickness T4, such as where a portion of thickness or height of thickness T4 is removed by etching, polishing or planarizing (e.g., using processes as described with respect to FIG. 5) to form thickness T1. Thickness T1 and/or surface 390 may have an average thickness, voids, pitting, and/or deviations as described above for thickness T4 and/or layer 302. Layer 302, thickness T4 and/or surface 390 may have the same crystal structure and orientation as all or a portion of thickness T1 of body 106. Specifically, layer 301 may be a layer from which all or a portion of thickness of body 106 is formed by suitable processes, such as including masking, etching, and polishing.

While the substrate with two bonded layers (e.g., substrate 102 and layer 302) with different crystal orientations is described above as formed from two separate substrates bonded together and then the carrier substrate 306 and insulator layer 304 removed, it may be formed differently in different embodiments. For example, a second device layer 302 that is not part of a substrate may be bonded or formed on substrate 102.

Figure 6:
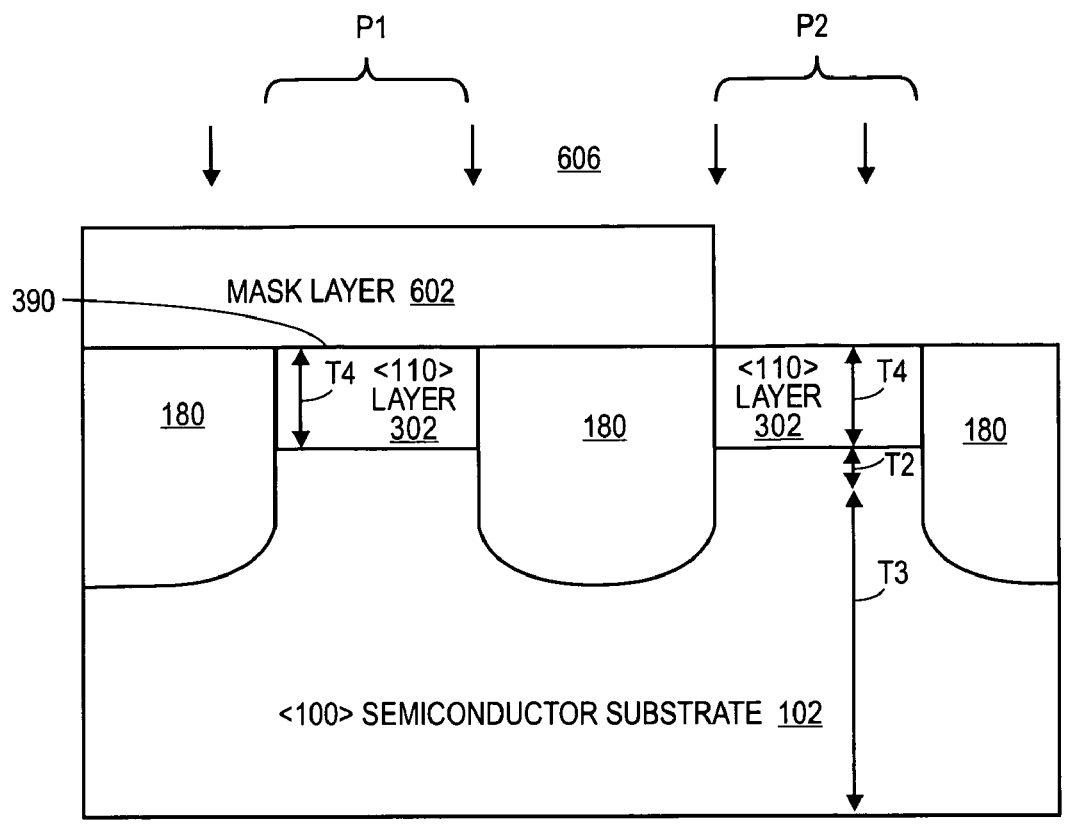
FIG. 6 is a cross sectional side view that illustrates how a portion of the device layer may be amorphized according to one embodiment of the present invention.

FIG. 6 is a cross sectional side view that illustrates how a portion of the device layer 302 may be amorphized according to one embodiment of the present invention. Isolation regions 180 are formed in substrate 102, such as by forming one or more regions or portions of insulator material through and below surface 390 and layer 302 and into substrate 102. Isolation regions 180 may be isolation regions formed of or including material as described above for FIG. 2. Isolation regions 180 may be regions of insulator material formed by etching a trench or via through and below surface 390 and layer 302 and into a thickness of substrate 102 and filling the trench or via with insulator material. Alternatively, isolation regions 180 may be formed by oxidizing, doping, or otherwise changing portions of layer 302 and substrate 102 from a semiconductor to an insulator material. For instance, the entire thickness of layer 302 (e.g., through and below surface 390 and 386) and a thickness of substrate 102 (e.g., through and below surface 382) may be changed to, or filled with insulator material at selected locations, portions, or areas of the wafer (e.g., selected top perspective areas or shapes of surface 390, such as areas surrounding and/or defining Fin shaped FETS).

Mask layer 602 is shown formed on surface 390 and on the surface of regions 180. It is considered that mask layer 602 may not be formed on the surface of regions 180, on only one of regions 180, or only on a portion of the surface of regions 180 according to certain embodiments, such as where amorphizing does not affect the material of regions 180. Thus, in some embodiments, mask layer 602 may be formed after regions 180. Alternatively, in some embodiments, regions 180 may be formed after mask layer 602. Also, regions 180 may be formed before amorphization of a portion of layer 302.

A mask layer 602 may protect portion P1 of the device layer 302 that will not be amorphized. The mask layer 602 may be, for example, a patterned layer of photoresist material, a metal, a dielectric, silicon nitride and the like. Ions 606 may be implanted into or through the device layer 302 to amorphize the former crystal structure of the device layer 302, creating an amorphized portion (e.g., see portion P2) of the device layer 302 and of a thickness T2 of substrate 102. Thus, in addition to the <110> crystal structure of thickness T4 of portion P2 of layer 302 being changed to an amorphous structure, the <100> crystal structure thickness T2 of a portion of substrate 102 may be changed to an amorphous structure. In an embodiment, arsenic, germanium, or silicon ions 606 may be implanted into or through layer 302 and into substrate 102, although other ions may be implanted. In some embodiments, the dopants 606 may be about the same size or a little bit larger than the atoms that make up device layer 302. A portion (e.g., portion P1 and/or P2) may describe an area of a wafer, die or chip, such as defined by a footprint at the top surface or a surface (e.g., surface 182, 184 or a combination thereof) of substrate 102 that has size sufficient to form an electric device therein or thereon (e.g., see FIGS. 9-12). Thus, in some cases, the entire combination of thicknesses T2+T4 is amorphized.

The dopants 606 may be neutral, or may be n- or p-type dopants. If an n- and/or p-type dopant is used, doping used to make transistors may compensate for the dopants already present. For example, if an n-type dopant 606 is used and a p-type transistor is formed on that portion of the substrate, extra p-type dopants may be used when making the transistor than would be used absent the doping steps described with respect to FIGS. 6 and 7. In other embodiments, the dopants 606 may be chosen to correctly dope the substrate for one or more of the later-formed devices. Dopants 606 may correctly dope the substrate for one type (n- or p-) of device in one embodiment. In this embodiment, the other type of device (e.g., at portion P1) may need extra doping later to compensate.

In an embodiment, the doping may be done with silicon or other ions having an energy in the range of 6-8 keV and a dose of $1 \times 10^{14}$ to $1 \times 10^{15}$ atoms/cm$^2$, and in another embodiment the doping may be done at about 7 keV and a dose of about $5 \times 10^{14}$ atoms/cm$^2$. For example, with a material of layer 302 and substrate 102 are both silicon, silicon ions may be implanted to preserve the semiconductor material of layers 302 and substrate 102 without deposition of other impurities. Alternatively, if it is desired, germanium may be used where layers 302 and substrate 102 include silicon and germanium. Moreover, a sufficient energy and dose of ions should be used to amorphize thickness T2 of substrate 102 that may be 5%, 10%, 15% or 20% of thickness T4. Alternatively, the energy and or iron implantation may be sufficient to amorphize thickness T2 of between 1 and 10 nanometers (nm) as well as thickness T4 of between 20 and 150 nanometers. For example, thickness T4 may be 50 nanometers and thickness T2 may be 10 nanometers. Other ions and other process conditions may be used in other embodiments such as at energy between 4 and 20 keV and dose of $1\times10^{12}$ to $1\times10^{17}$ atoms/cm$^2$. In an embodiment, the amorphizing may be done with germanium ions having an energy in the range of 65-75 keV and a dose of $1\times10^{13}$ to $1\times10^{14}$ atoms/cm$^2$, and in another embodiment, the doping may be done at about 70 keV and a dose of about $6\times10^{13}$ atoms/cm$^2$. Ions 606 may be described as having sufficient energy and being a proper type of ions to perform a high energy ion implantation to amorphize by breaking the crystal structure bonds of (and leaving amorphous bonds for) material of layer 302 and substrate 102 having thickness T4 plus T2 in portion P2 of the substrate.

In some cases, amorphizing may include Silicon Pre-amorphization (e.g., (Si PA) using a high dose & energy implant that amorphizes a semiconductor (e.g., silicon) layer (or in other words destroy or randomize the atomic structure of the crystalline lattice). The lattice can then be re-grown using the crystalline silicon layer below as the template. Other ions and other process conditions may be used in other embodiments.

FIG. 6 also shows thickness T3 such as a thickness that when added to thickness T2 is the total thickness of substrate 102. Thicknesses T1, T2, T3 and T4 may represent an average thickness, such as where thickness T4 and/or T1 is a thickness between 10 nm and 100 nm, thickness T2 is a thickness between 1 nm and 20 nm, and thickness T3 is a thickness between 100 nm and 1000 nm. Specifically, thickness T4 and/or T1 may be a thickness of 30, 40, 50, 60, or 70 nm, or a range between any of those thicknesses. Also, thickness T2 may be a thickness of 1, 2, 4, 8, 10, 20, or a range between any two of those thicknesses in thickness. As the thicknesses may represent an average, the difference in thickness from the average thickness may vary less than 2, 5, or 10 angstroms.

Figure 7:
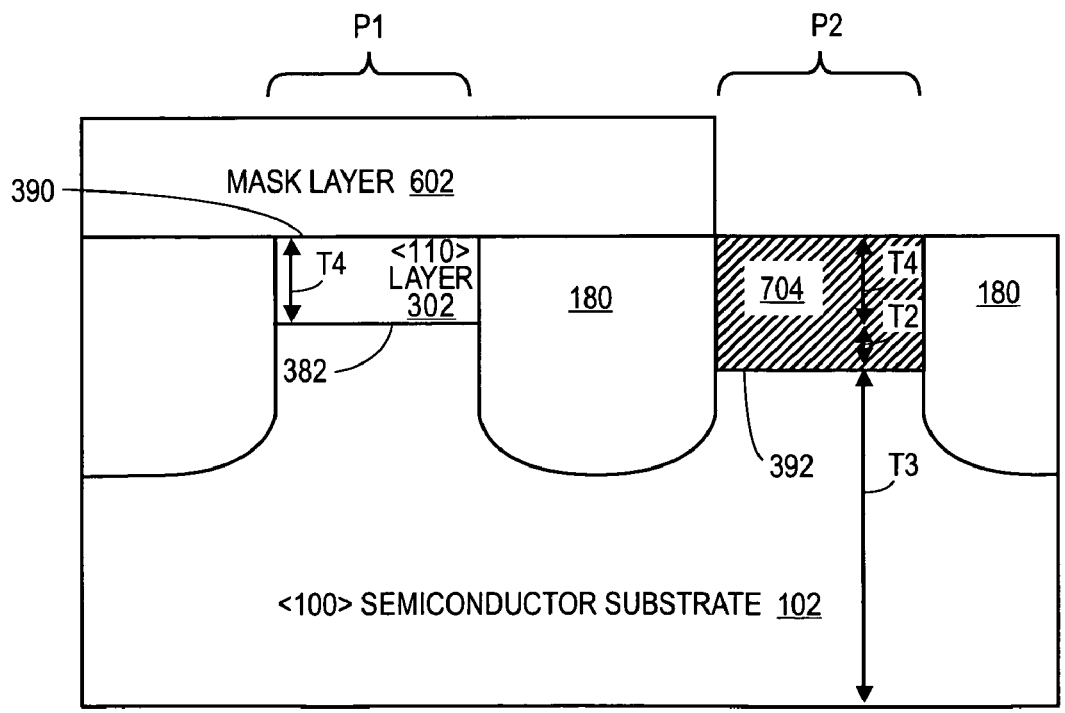
FIG. 7 is a cross sectional side view that illustrates the portion of the layers amorphized according to one embodiment of the present invention.

FIG. 7 is a cross sectional side view that illustrates the portion of the layers amorphized according to one embodiment of the present invention. A mask layer 602 has protected portion P1 of the second device layer 302 that will not be amorphized. Ions 606 implanted into portion P2 of the second device layer 302 have amorphized the former crystal structure of the second device layer 302, creating thickness T4 of amorphized portion 704 of the second device layer 302. Similarly, ions 606 implanted into portion P2 of substrate 102 have amorphized thickness T2 of substrate 102 creating thickness T2 of amorphized portion 704. Thus, amorphized portion 704 is an amorphous layer having a thickness of T4 (the thickness of layer 302) as well as thickness T2 of a fraction, portion or amount of the total thickness of substrate 102. Portion 704 may be described as a layer of amorphized material having thickness T4 plus T2 in portion P2 of the substrate. Thus surface 392, the current top or upper surface of substrate 102, has a crystal orientation of <100>, since surface 392 is below surface 382 which is at the interface or bonding surface between layer 302 and substrate 102.

When amorphizing to form amorphous portion 704, the energy, ion type, and ion concentration, as well as other parameters may be selected such that the peak concentration of implantation or implantation rate is at a depth below surface 390 equal to thickness T4, thickness T2, a depth in the range shown by thickness T2, or a depth in the range shown by thickness T3. Specifically, it can be appreciated that surface 392 may not form an exact boundary having amorphized semiconductor on one side and crystal semiconductor on the other side, but may instead define or represent an average of a concentration of amorphous to crystal semiconductor material, such as where half of the material is crystal and half of the material is amorphous. Thus, it is considered that at certain locations, the amorphous material of portion 704 may extend into thickness T3, and the crystal material of substrate 102 may extend into thickness T2, such as by 1, 2, 4, 8, any combination thereof, or a range between those numbers of angstroms above and below surface 392. Thus, substrate 102 retains its crystal structure and/or <100> crystal orientation at, touching or adjacent to surface 392, such that that crystal structure and/or crystal orientation of substrate 102 may be used to grow a similar crystal structure and/or crystal orientation above surface 392, in portion 704 or in another material deposited in place of or grown in place of material of portion 704.

Figure 8:
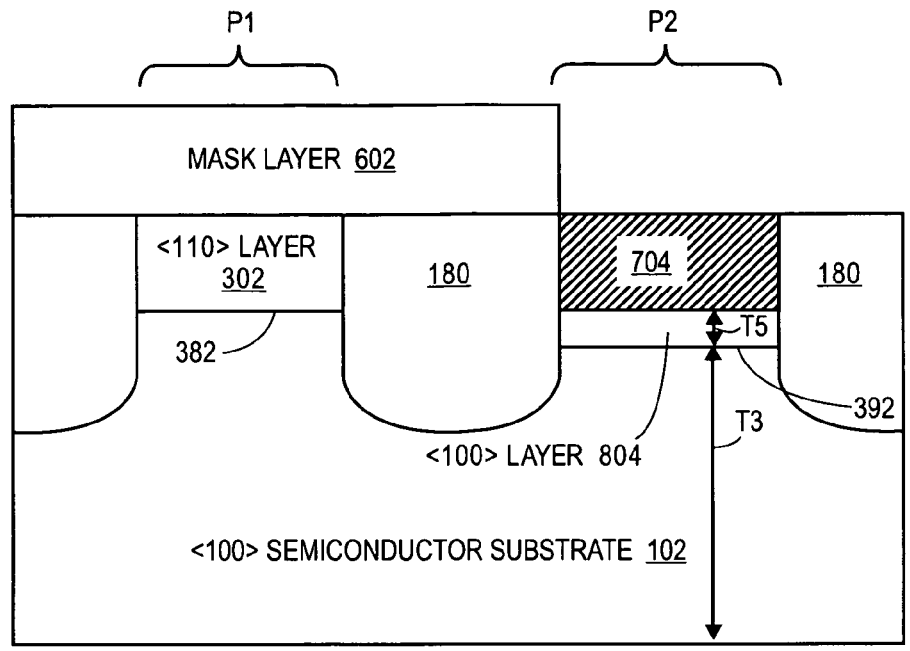
FIG. 8 is a cross sectional side view that shows the substrate after the amorphized portions has been partially recrystallized.

FIG. 8 is a cross sectional side view that shows the substrate after the amorphized portion 704 has been partially recrystallized, according to one embodiment. In an embodiment, the amorphized portion 704 may be recrystallized by annealing or heating the substrate. The amorphized portion may recrystallize with the atoms having the same crystal orientation as the orientation of the non-amorphized portion of substrate 102 or surface 392 to which the formerly amorphous section 704 is adjacent. For example, the bottom of amorphized portion 704 is adjacent to or touching substrate 102 (e.g., surface 392) having a <100> crystal orientation. Thus, the bottom of amorphized portion 704 will be recrystallized to have a <100> crystal orientation and become part of <100> layer 104.

Specifically, FIG. 8 shows recrystallized layer 104 having a crystal orientation <100> equal or similar to that of substrate 102. Layer 804 is shown having thickness T5, such as a thickness less than the thickness total of T4 plus T2. Specifically, surfaces 150, 152, and 154 described for FIG. 2 may have the same crystal orientation as material of layer 804. Also, other slices of the semiconductor material of layer 804 may have the same crystal orientation as substrate 102. Annealing may continue until thickness T5 increases to equal thickness T2 plus thickness T4, such as to recrystallize all of portion 704 to have the same or an equal crystal orientation as that of substrate 102. Recrystallizing may occur with or without mask layer 602, such as where annealing also effects layer 302 and/or other layers of substrate 102.

In an embodiment, the substrate may be annealed at a temperature between about 600-900 degrees Celsius. In some embodiments, if the substrate is annealed at higher temperatures it may be annealed for a duration of several minutes, and if the substrate is annealed at lower temperatures it may be annealed for a duration of several hours. In an embodiment, the substrate may be annealed at about 800 degrees Celsius for around 10 minutes. In other embodiments, different anneals may be performed. In some cases annealing may occur for 1, 2, 4, 8, 10, 20, 40, 80, or any combination thereof of minutes, such as at 400, 500, 550, 600, 650, 700, 750, 800, or a range in between any of those numbers of degrees Celsius in temperature. In some cases, annealing may occur for 30 minutes at 600, 700, 800 or a range between any of those numbers of degrees Celsius. Annealing may occur at atmospheric pressure or at another pressure and in an ambient of inert gas such as nitrous, oxygen, and the like.

Also, annealing may include minor effects to the crystal structure of layer 804 resulting from its interface with isolation regions 180. Thus, according to embodiments, the purity, crystal structure, and/or crystal orientation of layer 104 may be sufficient for forming electronic devices, such as transistors and tri-gate devices (e.g., such as to form the source, drain, and or channel of such devices as shown in FIG. 2). However, it can be appreciated that such effects will be minimal more than 2, 3, or 5 angstroms away from isolation regions 180, such as to allow the purity of layer 804 to be sufficient for forming an electronic device.

Figure 9:
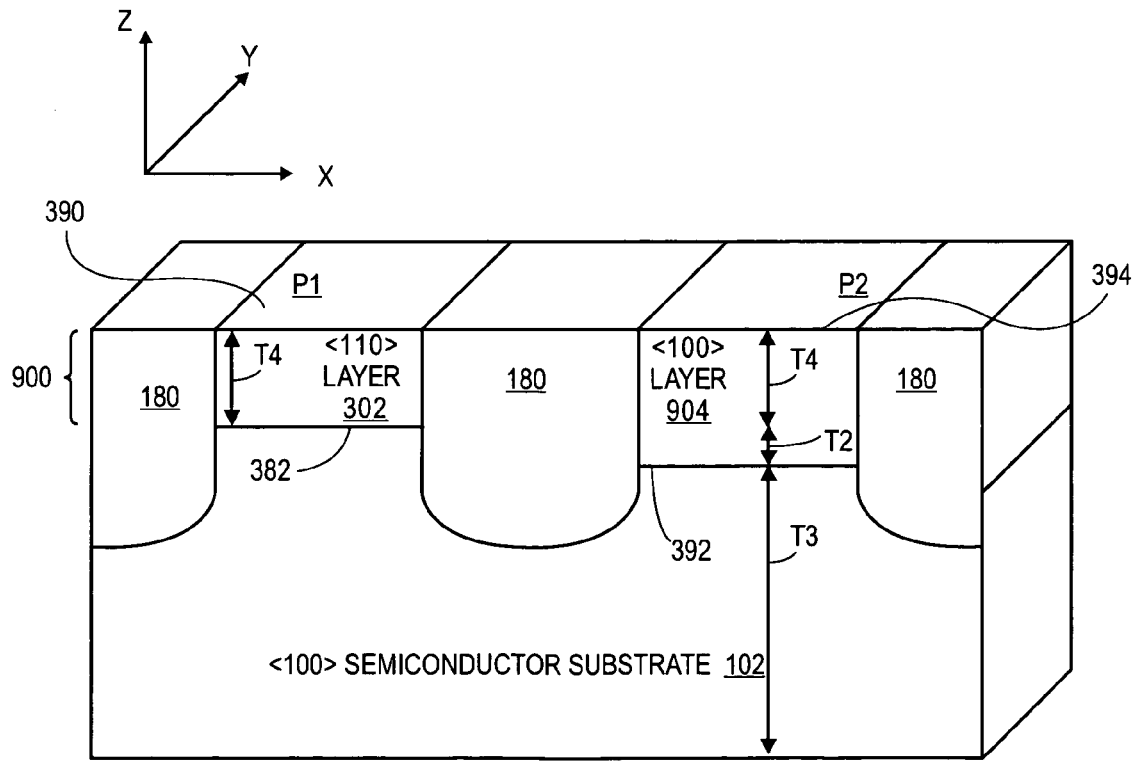
FIG. 9 is a perspective view that illustrates the substrate after the amorphized portion has been completely recrystallized.

FIG. 9 is a perspective view that illustrates the substrate after amorphized portion 704 has been completely recrystallized to form layer 104. In other words, crystallization of amorphous layer 704 by annealing to form layer 804 (e.g., see FIG. 8 and description above) continues until all or substantially all material of portion 704 is crystallized to form layer 904 having the same crystal orientation as substrate 102. The substrate may now be considered a top crystal layer and/or surface substrate, with a base semiconductor substrate 102, and a single top semiconductor (or device layer) layer 900 with portion P1 and P2 (or regions) having different crystal orientations. In the embodiment illustrated in FIG. 9, the substrate includes one or more <100> crystal orientations at portion P2, such as at surface 394 and having a crystal orientation as described above for body 108, as well as one or more <110> crystal orientations at portion P1, such as at surface 390 and having a crystal orientation as described above for body 106.

Annealing or heating portion 704 may be described as heating with sufficient energy, at a sufficient temperature, and/or for a sufficient time to organize the bonds of the material of portion 704 (e.g., material amorphized by a high energy ion implantation leaving amorphous bonds) into the same crystal structure and/or orientation of substrate 102. Various processes for this are considered including by heat lamps, rapid annealing, laser annealing, and the like, to organize, "grow" (e.g., re-grow or re-crystallize) or continue the crystal structure and/or orientation of substrate 102 into the amorphous material of portion 704 to form annealed or re-crystallized layer 904 having thickness T4 plus T2 in portion P2 of the substrate. Layer 904 may be a layer having the same crystal structure and orientation as layer 104 and body 108. Layer 302 and/or 904 (e.g., having thickness T4, surface 390 and/or surface 394) may be considered device layers. Specifically, layer 904 may be a layer from which body 108 and layer 104 are formed by suitable processes, such as including masking, etching, and polishing.

It is also contemplated that other embodiments may include other crystal orientations for the layers described herein to form dual orientation layers at portions P1 and P2. For example, the <100> and <110> crystal orientations of the layers shown in FIG. 9 may all be reversed, such as where substrate 102 and layer 904 have a <110> orientation, and layer 302 has a <100> crystal orientation for surfaces described for bodies 108 and 106 respectively. Alternatively, other crystal structures such as <101>, <111>, <100>, <110>, and other structures as known may be used for layers, surfaces, and substrates as described herein, provided that layer 302 has a different crystal orientation than substrate 102. For example, where the X, Y, Z coordinate axis of FIG. 9 is the same as that of FIG. 2, layer 302 and layer 904 may have crystal orientations equal to those described above for surfaces of body 106 and 108 in FIG. 2 and/or for Table 1 (e.g., for surfaces 140, 142, 144, 150, 152 and 154 as described in Table 1). Other embodiments may include crystal orientations for the semiconductor portions P1 and P2 other than those described above.

Figure 10:
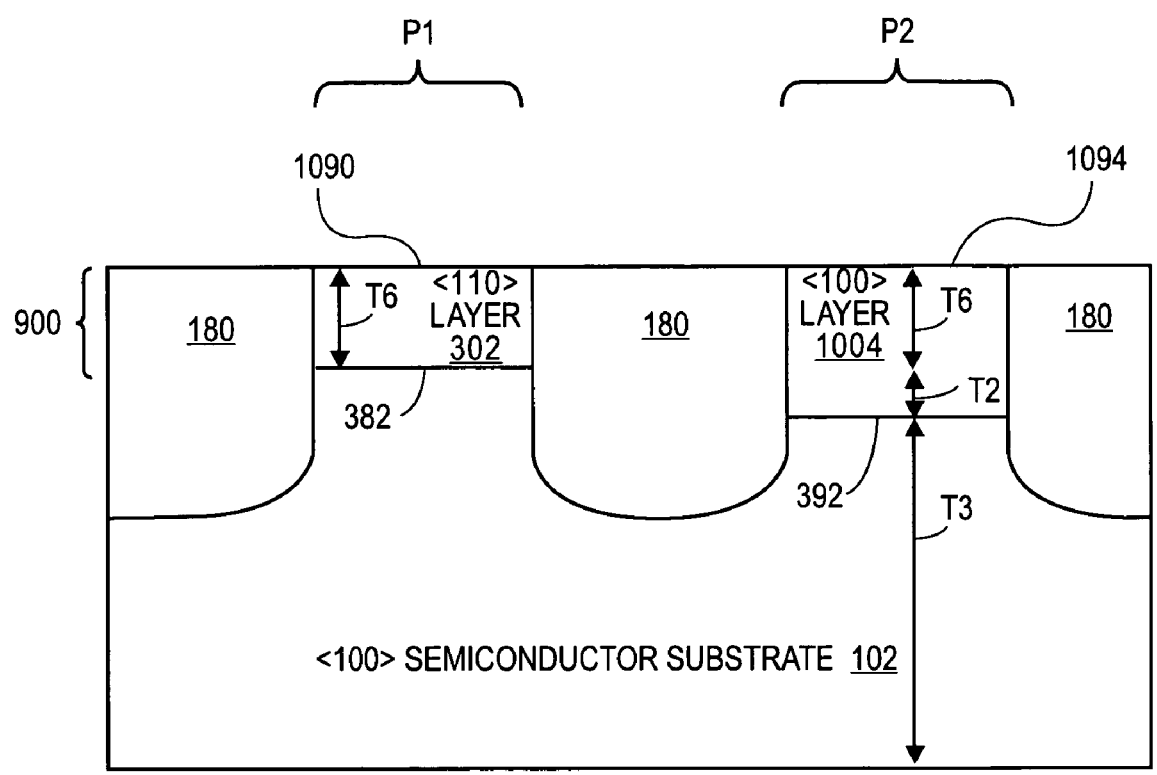
FIG. 10 is a cross sectional side view that illustrates the substrate after the semiconductor layer has been thinned.

FIG. 10 is a cross sectional side view that illustrates the substrate after the semiconductor layer 900 has been thinned. This thinning is optional. Any suitable processes may be used to thin the device layer 900, such as etching and/or polishing (e.g., as described for FIGS. 5 and/or 6). After thinning, the device layer 900 may have a thickness T6 for layer 302, and thickness T2 plus T6 for layer 1004 respectively. Thus, thickness T6 may be less than or equal to thickness T4, and/or may be the same as thickness T1. Thickness T6 is appropriate to form devices, such as transistors and/or tri-gate electronic devices from, in or on. Thickness T6, surface 1090 and/or surface 1094 may have an average thickness, voids, pitting, and/or deviations as described above for thickness T4 and/or layer 302. Layer 302 and/or 1004 (e.g., having thickness T6, surface 1090 and/or surface 1094) may be considered device layers. Layer 1004 may be a layer having the same crystal structure and orientation as layer 104 and body 108. Specifically, layer 1004 may be a layer from which body 108 and layer 104 are formed by suitable processes, such as including masking, etching, and polishing. Electronic devices, such as transistors, Fin-FETS, tri-gate transistors (e.g., having channel, source and drain regions with 3 or more surfaces), capacitors, resistors, diodes, and/or resonators may be formed from, in or on surfaces of layers 302 and 1004.

As another result of the thinning process, isolation regions 180 may extend above surface 1090 and surface 1094, such as where the thinning process is or includes etching of a thickness of layer 302 and of layer 1004, separately from (e.g., but not etching) isolation regions 180 (e.g., such as by masking isolation regions 180 or selective etching of layer 302 and of layer 1004). Alternatively, thinning may include grinding or polishing to remove a thickness of layer 302, layer 1004, and regions 180 that is equal or approximately equal. Moreover, according to some embodiments, thinning may not be performed, such as where surface 390 and surface 394 of FIG. 9 are the top surfaces of layer 302 and layer 1004 having thicknesses T4 and (T4 plus T2), respectively, appropriate to form devices, such as transistors and/or tri-gate electronic devices from, in or on.

Figure 11:
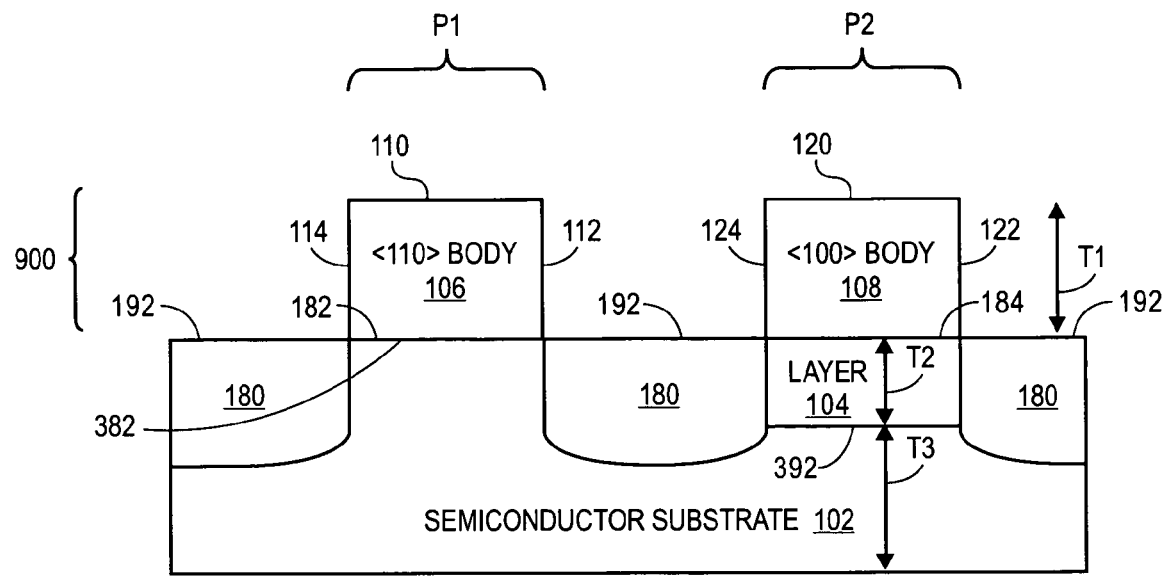
FIG. 11 is a cross sectional side view that illustrates the substrate after fins have been defined, on which tri-gate transistors may be formed.

FIG. 11 is a cross sectional side view that illustrates the substrate after bodies (e.g., fins) 106, 108 have been defined. Bodies 106, 108 may be formed by removing a thickness of regions 180 (e.g., all of regions 180 by separate or simultaneous processes). Removing a thickness of regions 180 to form bodies 106, 108 may be include suitable processes including masking, etching, and polishing of regions 180, separately from (e.g., but not removing or etching a thickness of) layer 302 and/or layer 1004 (or 904). In some cases, forming bodies may also include removing a thickness of (e.g., by masking, etching, and polishing) layer 302 and/or layer 1004 (or 904) (e.g., separately or simultaneously with the removal of a thickness of regions 180).

FIG. 11 also shows surface 182 and surface 184 formed from layer 302, layer 104, and/or substrate 102, such as described for FIG. 2. Likewise, FIG. 11 shows surfaces 192 formed from or on regions 180, such as described for FIG. 2 and/or above for forming bodies 106 and 108 (e.g., surfaces 192 may be formed by or the result of removing a thickness of regions 180). Surfaces 192 may be parallel with, planar with and/or level with surface 182 and/or 184. Specifically, body 106 may be formed from, in or on layer 302. In some cases, body 106 may consume, include, or have all of the same thickness of layer 302. Thus, body 106 and has the same crystal structure and orientation as layer 302. Top 110 (e.g., the surface of top 110) may or may not be the same surface as surface 1090. For instance top 110 may be a surface formed in layer 302 below surface 1090 by a suitable processes used to thin layer 302 (e.g., at surface 1090), such as etching and/or polishing (e.g., as described for FIGS. 5 and/or 6). Also, body 108 and surface 184 may be formed from, in or on layer 1004. Thus, body 108 and surface 184 have the same crystal structure and orientation as layer 1004. Top 120 (e.g., the surface of top 120) may or may not be the same surface as surface 1094. For instance top 120 may be a surface formed in layer 1004 below surface 1094 by a suitable processes used to thin the layer 1004 (e.g., at surface 1094), such as etching and/or polishing (e.g., as described for FIGS. 5 and/or 6).

As shown in FIG. 11, defining the bodies 106, 108 may also result from or result in removing a thickness of regions 180 between and beside (e.g., adjacent to) the portions P1 and P2 of the device layer 900. This removing may be or include etching to remove a thickness of regions 180 using a simultaneous etch for all regions 180, a mask and etch process, a recess etch process, a etch process using HF as an etchant, and/or a selective etch process. This removing or etch may define bodies 106 and 108 as the channels of the transistors formed as or after thicknesses of regions 180 shown in FIG. 10 are recessed. It is that recess (e.g., the thickness of regions 180 removed or etched) that defines thickness T1 (e.g., the height of the sidewalls 114/112 and/or 124/122). Thus, bodies 106 and 108 are in effect the FINs of the FINFET or Trigate device (e.g., of device 100). Hence surface 182 in FIGS. 2A-C, and 11 may be defined or described as a planar region or shape within substrate 102 parallel with, planar with and/or level with any of surfaces 192. Similarly, surface 184 in FIGS. 2A-C, and 11 may be defined or described as a planar region or shape within layer 104 parallel with, planar with and/or level with any of surfaces 192.

Formation of surfaces 192 may form or be included in a process for forming sidewalls 112, 114, 122, and 124. For example, removal of a thickness of regions 180 may remove material of regions 180 that is against, touching, beside and/or adjacent to sidewalls 112, 114, 122, and 124 such that remover of the material of regions 180 leaves sidewalls 112, 114, 122, and 124 exposed (e.g., thus forming those sidewalls). Similarly, although not shown, formation of the front and back surfaces of bodies 106 and 108 (e.g., parallel to the page of FIGS. 2A-C) may include isolation regions and similar processes described above for forming sidewalls 112, 114, 122, and 124. That is, isolation regions similar to regions 180 may exist in front of and behind bodies 106 and 108 (e.g., beyond the end of the source and drain regions). Removal or etching of these isolation regions may form the front and back ends of bodies 106 and 108 (e.g., ends of the source and drain regions).

Surface 182 may or may not be the same surface as surface 382. For instance surface 182 may be a surface formed in, on or below layer 302 or substrate 102, as described for FIG. 2A-C, and/or by a suitable processes used to remove, etch or thin regions 180, such as etching and/or polishing. Likewise, surface 184 may be a surface formed in or on layer 1004, as described for FIG. 2A-C, and/or by a suitable processes used to remove, etch or thin regions 180, such as etching and/or polishing. Thus, surface 182 may be below surface 1090, and may be above, level with, or below surface 382. Moreover, surface 184 may be below surface 1094, may be level with surface 382, and/or may be above surface 392. Similarly, layer 104 may be formed from, of, in or on 1004. Thus, layer 104 and surface 184 may have the same crystal structure and orientation as layer 1004. It can be appreciated that the height or thickness of body 106 may be greater or less than that of body 108.

Bodies 106, 108 may be considered semiconductor portions on substrate 102 and layer 104, from which transistors, such as transistors 160, 170 of FIG. 2A-C, may be formed. The bodies 106, 108 may also be considered different portions or regions of a top dual crystal oriented semiconductor layers 302 and 104 of the substrate. As each body 106, 108 is defined from a different portion P1/P2 of the device layer 900, each body 106, 108 has a different crystal orientation. Body 106 may have a <110> along top 110 (e.g., the surface of top 110), sidewall 112, and sidewall 114 as shown in FIG. 2A-C. The rest of transistor 160 may then be formed to result in a device as illustrated and/or described for FIG. 2A-C. Also, body 108 may have a <100> crystal orientation along top 120 (e.g., the surface of top 120), sidewall 122, and sidewall 124 as shown in FIG. 2A-C. The rest of transistor 170 may then be formed to result in a device as illustrated and/or described for FIG. 2A-C.

Thickness T1, top 110 (e.g., the surface of top 110), sidewall 112, sidewall 114, surface 182, top 120 (e.g., the surface of top 120), sidewall 122, sidewall 124, and/or surface 184 may have an average thickness, voids, pitting, and/or deviations as described above for thickness T4 and/or layer 302. According to embodiments, crystal structures and orientations for surfaces and tops of bodies 106 and 108 may be other than <110> and <100>, respectively, such as other orientations as described for FIGS. 2A-C, and 3B.

While the Figures and description above are concerned with tri-gate transistors having channel, source and drain regions with 3 or more surfaces, other types of transistors or electronic devices may also be formed from, in or on device layers 302 and 104. For instance, electronic devices, such as transistors, Fin-FETS, capacitors, resistors, diodes, and/or resonators may be formed from, in or on bodies 106 and 108 (e.g., from in or on or one or more surfaces of those bodies). The transistors formed using layers 104 and 302 (e.g., using bodies 160 and/or 108) may be multi-gate or single gate, such as planar, transistors in some embodiments. As the device layer 900 may have <100> and <110> portions (or other different crystal orientations), p-type and n-type transistors may both be formed on surfaces 390/1090 and 394/1094 of the device layer 900, each with a crystal orientation to provide high performance for each type of transistor.

Figure 12:
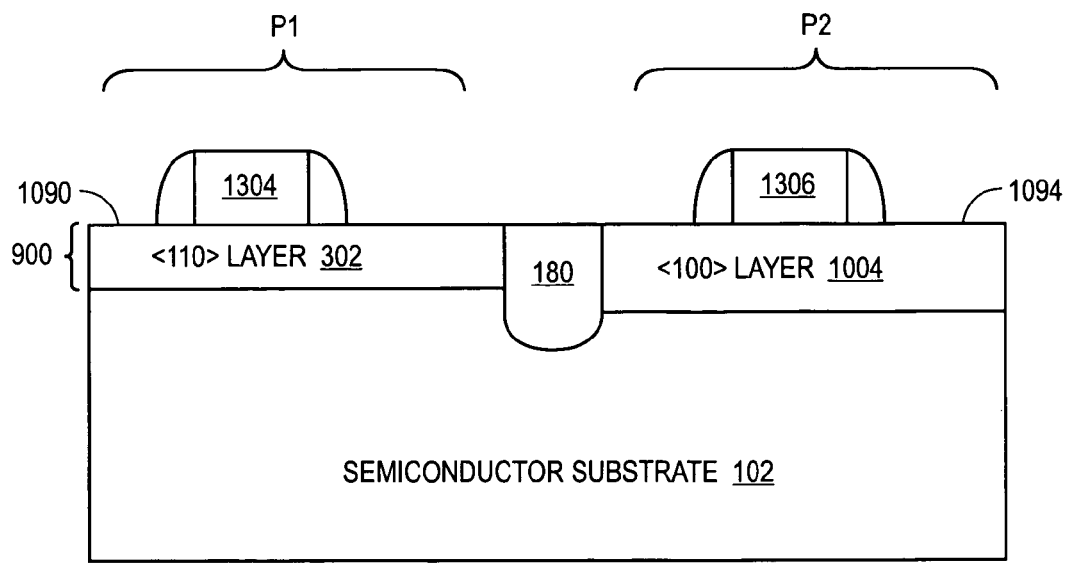
FIG. 12 is a cross sectional side view that illustrates one such device that includes planar transistor on a device layer having portions with different crystal orientations, according to another embodiment of the present invention.

FIG. 12 is a cross sectional side view that illustrates one such device that includes planar transistor on a device layer having portions with different crystal orientations, according to another embodiment of the present invention. The device of FIG. 12 includes a semiconductor substrate 102 and a device layer 900. Together, these layers 102 and 900 are a dual crystal device substrate. There is a portion P1 of the device layer 302 of layer 900 with a <110> crystal orientation. A p-type planar transistor, including a gate electrode 1304, spacers, gate dielectric, and other regions is on the portion P1 with <110> crystal orientation. There is a portion P2 of the device layer 1004 of layer 900 with a <100> crystal orientation. An n-type planar transistor, including a gate electrode 1306, spacers, gate dielectric, and other regions is on the portion P2 with <100> crystal orientation.

Although layer 302 and layer 104 may have crystal orientations in three dimensions as described above with respect to FIG. 2A-C and Table 1, it can be appreciated that for planar gate devices as shown in FIG. 12, the orientation with respect to the X and Y coordinates shown in FIG. 2A-C may be oriented at any angle on surface 1090 and 1094. For example, those surfaces will have a <110> and <100> crystal orientation, respectively, regardless of the orientation of the channel under electrode 1304 and electrode 1306. This allows the channel region under 1304 and 1306 (e.g., between source and drain and diffusion regions) to be oriented at any angle with respect to the X and Y directions shown in FIG. 2 and/or each other. This may provide the advantage of allowing for various layouts of transistors to increase the efficiency of layout for circuitry such as logic, where it is possible and desired to select an orientation of the channel regions other than a parallel orientation.

Figure 13:
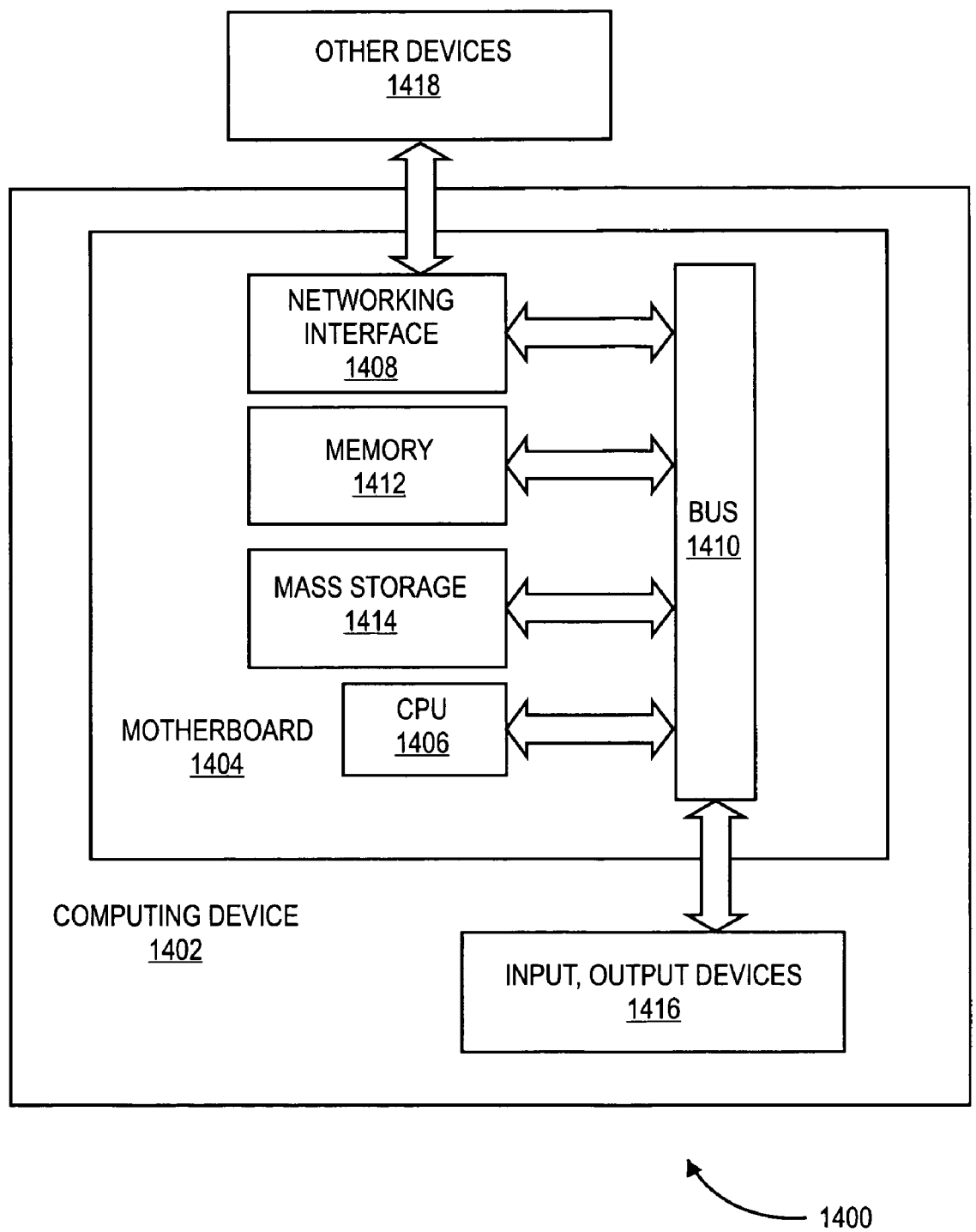
FIG. 13 illustrates a system in accordance with one embodiment of the present invention.

FIG. 13 illustrates a system 1400 in accordance with one embodiment of the present invention. One or more devices 100 formed from, in or on a device layer 900 having regions P1, P2 with different crystal orientations as described above may be included in the system 1400 of FIG. 13. As illustrated, for the embodiment, system 1400 includes a computing device 1402 for processing data. Computing device 1402 may include a motherboard 1404. Coupled to or part of the motherboard 1404 may be in particular a processor 1406, and a networking interface 1408 coupled to a bus 1410. A chipset may form part or all of the bus 1410. The processor 1406, chipset, and/or other parts of the system 1400 may include one or more devices 100 formed from a device 900 layer having regions P1, P2 with different crystal orientations.

Depending on the applications, system 1400 may include other components, including but are not limited to volatile and non-volatile memory 1412, a graphics processor (integrated with the motherboard 1404 or connected to the motherboard as a separate removable component such as an AGP or PCI-E graphics processor), a digital signal processor, a crypto processor, mass storage 1414 (such as hard disk, compact disk (CD), digital versatile disk (DVD) and so forth), input and/or output devices 1416, and so forth. In various embodiments, system 1400 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 1406, 1414, etc. in FIG. 13 may include one or more devices 100 formed with one or more devices 100 formed from a device 900 layer having regions P1, P2 with different crystal orientations as described herein. For example, transistors formed on a device 900 layer having regions P1, P2 with different crystal orientations may be part of the CPU 1406, motherboard 1404, graphics processor, digital signal processor, or other devices.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. Also, the embodiments of a device or article described herein can be manufactured, used, or shipped in a number of positions and orientations.

The concepts above for device 100 may be applied to a different type of device than a FIN-FET transistor. In some cases, the device may be a different type of transistor, such as a planar transistor, or a different type of device such as a capacitor, resistor, diode, or resonator formed in or on bodies 106 and 108, or surfaces of layers 302 and 1004. Thus, persons skilled in the relevant art can appreciate that many modifications and variations are possible in light of the above teaching. Persons skilled in the art will also recognize various equivalent combinations and substitutions for various components shown in the Figures. It is therefore intended that the scope of the invention be limited not by this detailed description, but rather by the claims appended hereto.

We claim:

1. A device comprising:
a first channel region on a substrate and having a first plurality of channel surfaces to be biased by a plurality of gate surfaces of a gate structure, wherein the channel surfaces have a first same crystal orientation;
a second channel region on the substrate, the second channel region having a second plurality of channel surfaces to be biased by a plurality of gate surfaces of the gate structure, wherein the channel surfaces have a second same crystal orientation; and
wherein the first channel extends above and touches a semiconductor surface of the substrate having the second same crystal orientation, the second channel extends above and touches a semiconductor surface of a layer on the substrate having the second same crystal orientation, and the first plurality of channel surfaces are parallel with the second plurality of channel surfaces.

2. The device of claim 1 wherein the plurality of channel surfaces comprise a top surface, a left side surface, and a right side surface comprising a same crystal orientation of a <100> crystal orientation or a <110> crystal orientation.

3. The device of claim 2 wherein the substrate is a bulk substrate, the first same crystal orientation is a <110> crystal orientation, and the second same crystal orientation is a <100> crystal orientation.

4. The device of claim 1, wherein the semiconductor surface of the substrate having the second same crystal orientation and the semiconductor surface of a layer on the substrate having the second same crystal orientation are the same semiconductor material.

* * * * *